US012644906B2

(12) United States Patent
Murphy

(10) Patent No.: US 12,644,906 B2
(45) Date of Patent: Jun. 2, 2026

(54) ELECTRIC FENCING WIRE TESTER

(71) Applicant: FORCEFIELD ACTIVE TECHNOLOGY LIMITED, Ennis (IE)

(72) Inventor: Aidan Murphy, Dublin (IE)

(73) Assignee: FORCEFIELD ACTIVE TECHNOLOGY LIMITED, Ennis (IE)

( * ) Notice: Subject to any disclaimer, the term of this patent is extended or adjusted under 35 U.S.C. 154(b) by 124 days.

(21) Appl. No.: 18/481,583

(22) Filed: Oct. 5, 2023

(65) Prior Publication Data

US 2024/0118312 A1 Apr. 11, 2024

(30) Foreign Application Priority Data

Oct. 5, 2022 (IE) .................................. S2022/0159

(51) Int. Cl.
| | |
|---|---|
| *G01R 19/165* | (2006.01) |
| *B26B 11/00* | (2006.01) |
| *G01R 1/04* | (2006.01) |
| *G01R 1/067* | (2006.01) |
| *G01R 1/28* | (2006.01) |
| *H05C 1/06* | (2006.01) |

(52) U.S. Cl.
CPC ........ *G01R 1/06705* (2013.01); *B26B 11/008* (2013.01); *G01R 1/0416* (2013.01); *G01R 1/06788* (2013.01); *G01R 1/28* (2013.01); *G01R 19/16509* (2013.01); *H05C 1/06* (2013.01)

(58) Field of Classification Search
None
See application file for complete search history.

(56) References Cited

U.S. PATENT DOCUMENTS

| | | | | |
|---|---|---|---|---|
| 3,657,648 A | * | 4/1972 | Malme ................. | G01R 19/145 |
| | | | | 324/133 |
| 6,915,540 B2 | * | 7/2005 | Trbovich, Jr. ........ | B26B 11/008 |
| | | | | 7/118 |
| 9,829,515 B1 | * | 11/2017 | Cho .................... | G01R 1/06788 |
| 2010/0011593 A1 | * | 1/2010 | Trbovich, Jr. ........ | B26B 11/008 |
| | | | | 30/340 |
| 2022/0234224 A1 | * | 7/2022 | Glesser ................. | H02J 50/001 |

FOREIGN PATENT DOCUMENTS

WO WO-2008011517 A1 * 1/2008 ............. B25B 15/00

* cited by examiner

*Primary Examiner* — Richard Isla
(74) *Attorney, Agent, or Firm* — Sughrue Mion, PLLC

(57) ABSTRACT

A fence tester for testing the voltage in an electric fence comprises a handle member and a blade member pivotally coupled to the handle member between an open state extending from the handle member and a closed state partly recessed into the handle member. The handle member defines a hollow interior region, and comprises a printed circuit board having an electronic monitoring circuit therein. An antenna coupled to the electronic monitoring circuit is configured to conduct an electrical current induced therein by an electric field generated by a pulsating voltage in the electric fence when the fence tester is located adjacent the electric fence. A latching element located in the handle member operated by a manually operated operating element in the handle member latches the blade member in the open state and the closed state.

4 Claims, 20 Drawing Sheets

ANTENNA

A1

62

122

SIGFOX
TRANSMITTER
IC 126    130

SPI PORT

PANIC
BUTTON

MCU 120    124

128

132    VBAT

VCC

139

S1   SOS
Switch

Interrupt Pulse

142

R1

C1   140

R2

GND

ELECTRIC FENCING WIRE TESTER

FIELD OF THE INVENTION

The present invention relates to a fence tester and more specifically a fence tester configured to permit the detection and measurement of a voltage of an electrical fence.

BACKGROUND OF THE INVENTION

An electrical fence is a barrier that uses electric shocks to deter animals from crossing a boundary. A power energizer converts power into a brief high voltage pulse which the energizer releases along the electrical fencing wire. The energizer is also connected to a ground/earth rod implanted in the earth. An animal touching both the wire and the earth during a pulse will complete an electrical circuit and will conduct the pulse and receive an electric shock. The effects of the shock at least partially depend upon the voltage of the pulse.

An adequately designed and constructed electrical fence works by the combination of a weak physical barrier (the fence) and a strong psychological imprint created in the mind of the animal (from the sting of the electric shock). An electrical fence is designed to use the electricity in the fence as the deterrent. In the absence of electricity, the fence is useless and will not fulfill its function.

When properly installed and insulated from the ground an electrical fence should produce at least 3 kV, although the minimum EU levels for different types of animals are as follows:

Horses and cattle=1.5 kV

Calves=2 kV

Sheep (have a natural insulation through their wool)=3 kV

Electrical fences may be used to create boundaries for very large territories which may include rough terrain. Similarly, electrical fences can be damaged by high winds, falling trees etc. This can break the electrical connection between the fence and the energizer so that the electrical fence no longer carries the electrical pulses. Similarly, overgrown vegetation touching the fence line can "load" the fence (touching it, causing voltage to leak to ground, reducing the voltage on the fence line). Thus, when an electrical fence is built, monitoring its voltage regularly is a basic management practice.

In view of the potentially large areas bounded by the electrical fencing, farmers may also have to trudge across large distances on foot to reach off-road electrical fences. Similarly, in the interests of time-efficiency it is desirable to repair a damaged electrical fence as soon as it is detected. To do this, electrical fence repair tools are needed. But this adds to the weight and number of tools a farmer may have to carry with them when walking across potentially large distances; and is especially inconvenient under inclement weather conditions.

SUMMARY OF THE INVENTION

According to the invention there is provided a fence tester comprising a handle member coupled with a blade member by a pivoting member which is configured to cause the blade member to move between an open state in which the blade member is extended from the handle member and a closed state in which the blade member is folded into a central recess in the handle member, wherein a closeable housing configured to accommodate an electronic circuit is formed in each of the opposing sides of the handle member and the fence tester comprises a further closeable housing configured to house a power supply; characterised in that the fence tester comprises a watertight channel formed in the handle member and the pivot member and containing an electrical coupling means to permit the coupling of the power supply with the electronic circuit without exposure to the elements.

Preferably, the watertight channel is formed in the pivoting member and in the handle member and is configured to permit the daisy chaining of a first electronic circuit to a second electronic circuit and the second electronic circuit to the power supply.

Preferably, the housing for the power means is formed in a first side of the pivoting member and comprises a slot to permit access to the power supply by a probe inserted through the pivoting member to the other side thereof to make contact with the second electronic circuit; and the handle member comprises a water tight channel formed between both housings at an end of the handle member distanced from the pivoting member, the said channel comprising a wire electrically coupling the second electronic circuit to the first electronic circuit.

Preferably, the second electronic circuit is a voltage detector circuit comprising an antenna.

Desirably, the handle member comprises a hooking member configured to hold an electrical fencing wire and the hooking member is distanced from the antenna to permit accurate measurement of a voltage of the electrical fencing wire by the voltage detection circuit.

Desirably, the antenna is coupled with a peak-detector circuit comprising a capacitor which is chargeable by a voltage induced in the antenna by a voltage pulse issued by an electrified electrical fencing wire held in the hooking member, and a corresponding voltage of the capacitor is drainable therefrom to a ground voltage by a bleed-off resistor sandwiched therebetween at sufficient rate to cause the capacitor to be discharged before the issuance of a next voltage pulse by the electrical fencing wire.

Desirably, the capacitor is coupled with a microcontroller unit which is configured to be activated from a low current consumption sleep mode in the event the voltage of the capacitor exceeds a pre-defined reference voltage, to convert the value of the voltage of the capacitor to a value corresponding with the voltage of the pulse issued by the electrified electrical fencing wire.

Preferably, the microcontroller unit is coupled with a plurality of illumination means and is configured to activate one of the illumination means according to the voltage of the pulse issued by the electrified electrical fencing wire.

Preferably, the first electronic circuit is a user activatable alert issuing circuit.

Preferably, the alert issuing circuit comprises a microcontroller unit coupled with a user activatable switch and a transmitter unit to cause an alert signal to be transmitted therefrom, and the alert signal comprises the geographic co-ordinates of the location of the fence tester.

Desirably, the microcontroller unit is configured to be activated from a low current consumption sleep mode on activation of the switch to assemble an alert signal comprising an identifier of the fence tester, a value of the charge of the power supply and the GPS co-ordinates of the fence tester; and to communicate the alert signal to the transmitter unit for transmission therefrom.

Desirably, the microcontroller unit is configured to return to a low current consumption sleep mode on receipt of an acknowledgement that the alert signal has been received by a remote receiver and otherwise cause the transmitter unit to retransmit the alert signal.

Desirably, the alert issuing circuit employs the Sigfox communications network.

Preferably, the fence tester is configured to undertake checks of the performance of the components of its electronic circuits and to issue reports of the outcome of the tests to a remote computing device for subsequent analysis and actions.

Preferably, the handle member and closure means for the housings and the pivoting member are each formed from a waterproof plastics material.

Additionally, the invention provides a fence tester comprising:

a handle member defining a hollow interior region and a central recess, a blade member, a pivot member pivotally coupling the blade member to the handle member with the blade member pivotal about the pivot member relative to the handle member between an open state with the blade member extending from the handle member and a closed state with the blade member folded into the central recess in the handle member, a latching element spring urged into engagement with the blade member for retaining the blade member in the open state, and a manually operated operating element cooperable with the latching element for disengaging the latching element from the blade member to permit movement of the blade member between the open state and the closed state.

In one embodiment of the invention the latching element is configured for retaining the blade member in the open state and the closed state thereof.

Preferably, the latching element is cooperable with a first receiving means of the blade member for retaining the blade member in the open state.

In another embodiment of the invention the latching element is cooperable with a second receiving means of the blade member spaced apart from the first receiving means for retaining the blade member in the closed state.

Preferably, the latching element comprises an engagement member selectively engageable with the first receiving means.

Preferably, the latching element is located in the hollow interior region of the handle, and advantageously, the operating element is mounted on the handle member and extends through the handle member into the hollow interior region for engaging the latching element.

In one embodiment of the invention the pivot member defines a primary pivot axis about which the handle is pivotal between the open state and the closed state, and the latching element is pivotally mounted in the handle about a secondary pivot axis extending parallel to the primary pivot axis, the latching element being pivotal about the secondary pivot axis between an engaged state engageable with the blade member in the open state and a disengaged state disengaging the blade member.

Preferably, a spring element integrally formed with the latching element urges the latching element into engagement with the blade member.

Advantageously, the spring element acts between the handle member and the latching element.

In one embodiment of the invention the spring element comprises a leaf spring.

The invention also provides a fence tester comprising:

a handle member defining a hollow interior region, a blade member,

a pivot member pivotally coupling the blade member to the handle member with the blade member being pivotal relative to the handle member between an open state with the blade member extending from the handle member and a closed state with the blade member folded into a central recess in the handle member, and an electronic monitoring circuit located in the hollow interior region of the handle member for monitoring a voltage in an adjacent electrically conductive wire.

Preferably, the electronic monitoring circuit comprises an antenna.

Advantageously, the antenna is located in the hollow interior region of the handle member.

Ideally, the antenna is configured to carry an electrical current induced therein by a magnetic field generated by a voltage in an adjacent electrically conductive wire.

Preferably, the electronic monitoring circuit is configured to monitor a pulsating voltage in an adjacent electrically conductive wire.

DESCRIPTION AND DRAWINGS

An embodiment of the invention is herein described by way of example only with reference to the accompanying drawings in which:

FIG. 16 is a back elevation view of a lower half of the fence tester of the preferred embodiment in the closed state;

DETAILED DESCRIPTION

While certain specific features are illustrated in the above figures, those skilled in the art will appreciate from the present disclosure that various other features have not been illustrated for the sake of brevity and so as not to obscure more pertinent aspects of the implementations disclosed herein.

Figure 1:
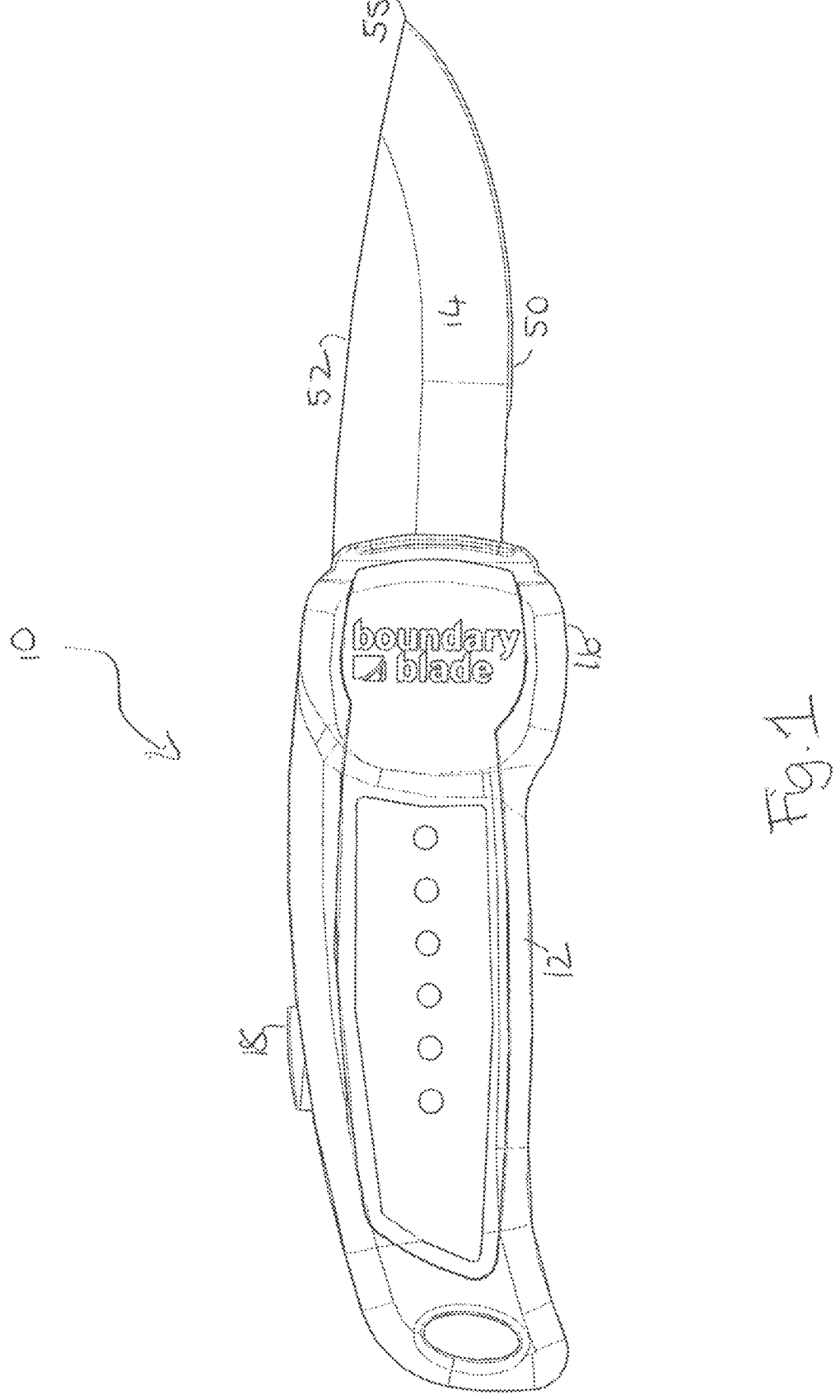
FIG. 1 is a front elevation view of an upper half of the fence tester of the preferred embodiment in an open state.
Figure 2:
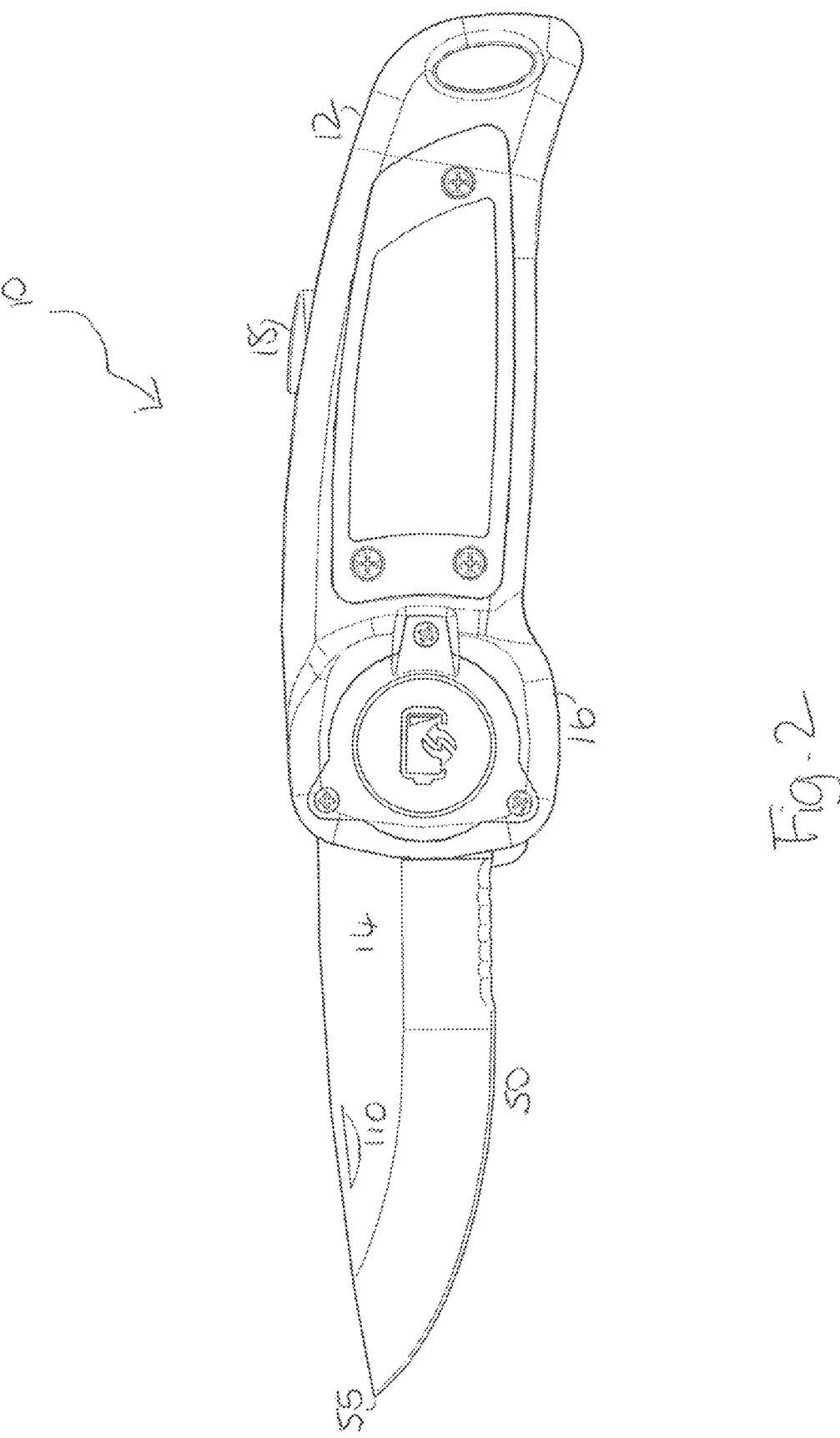
FIG. 2 is a perspective view of a lower half of the fence tester of the preferred embodiment in the open state.

Referring to FIG. 1 and FIG. 2, the fence tester 10 comprises a handle member 12 pivotally coupled with a blade member 14. The handle member 12 may be configured to be held by the hand of a user (not shown) and may comprise a gripping surface (not shown) to assist the user in holding the handle member 12. The handle member 12 may comprise a bulbous hollow pivoting section 16 disposed at one end thereof. The pivoting section 16 comprises an interior cavity (not shown) extending laterally therethrough and configured to house a pivotable coupling mechanism (not shown) for the handle member 12 to the blade member 14. The pivotable coupling mechanism (not shown) will be described in more detail later. The handle member 12 may also comprise a manually operated operating element, namely, an unlocking button 18 mounted on a side of the handle member 12 and disposed within easy reach of the user of the fence tester 10. The unlocking button 18 is coupled with a spring member 61 discussed below for permitting the blade member 14 to be operated between an open state and a closed state as will be discussed later.

Figure 3:
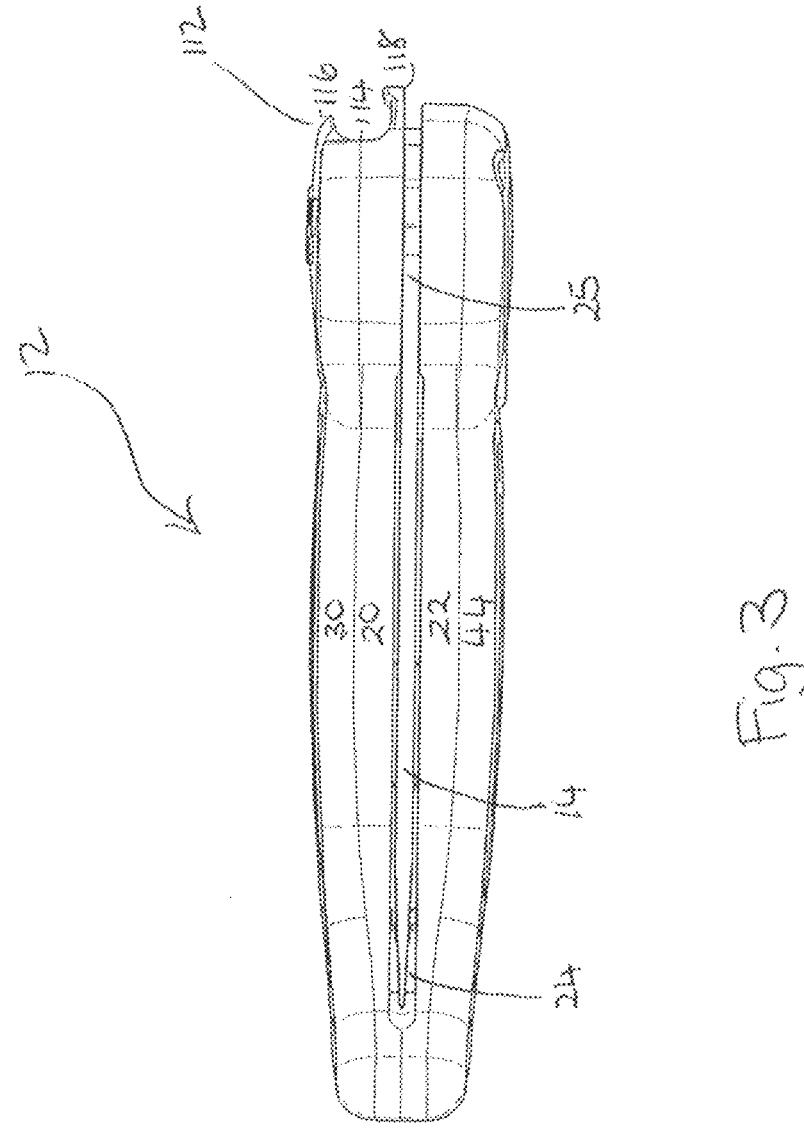
FIG. 3 is a longitudinal cross sectional view of the fence tester of the preferred embodiment.

Referring to FIG. 3, the handle member 12 may comprise an upper half 20 and a lower half 22, which are at least partly separated from each other by an elongated slot-shaped first recess 24. Adjoining the interior cavity 25 of the pivoting section 16 and extending from the interior cavity 25 into the body of the handle member 12, the first recess 24 may be disposed substantially in the centre of the handle member 12 and may be arranged so that its longitudinal axis is co-axially aligned with the longitudinal axis of the handle member 12. The first recess 24 may be further dimensioned to accommodate the length of the blade member 14 and at least some of the width of the blade member 14.

Figure 4:
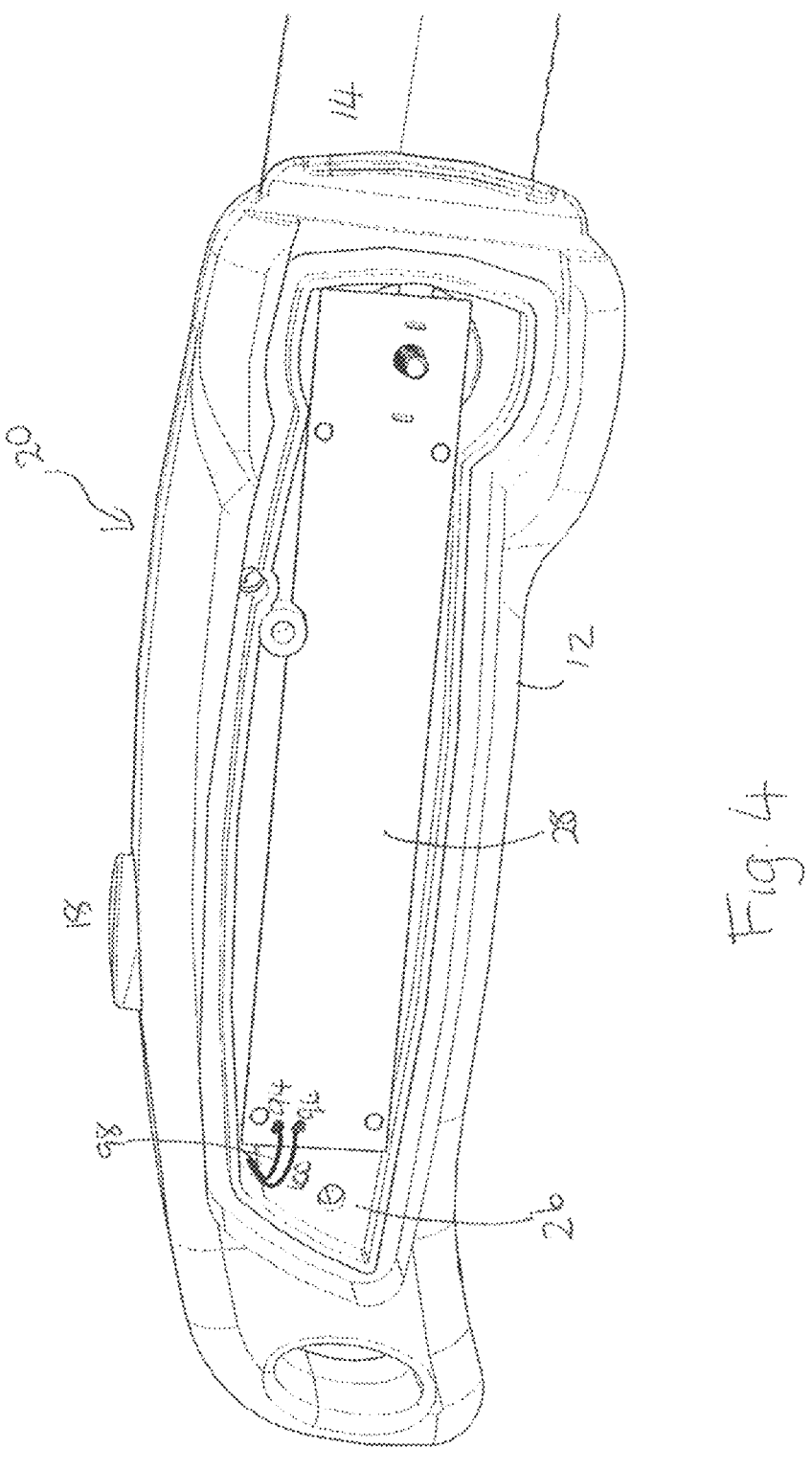
FIG. 4 is a perspective view of the upper half of the fence tester of FIG. 1 with a cover removed therefrom.
Figure 6:
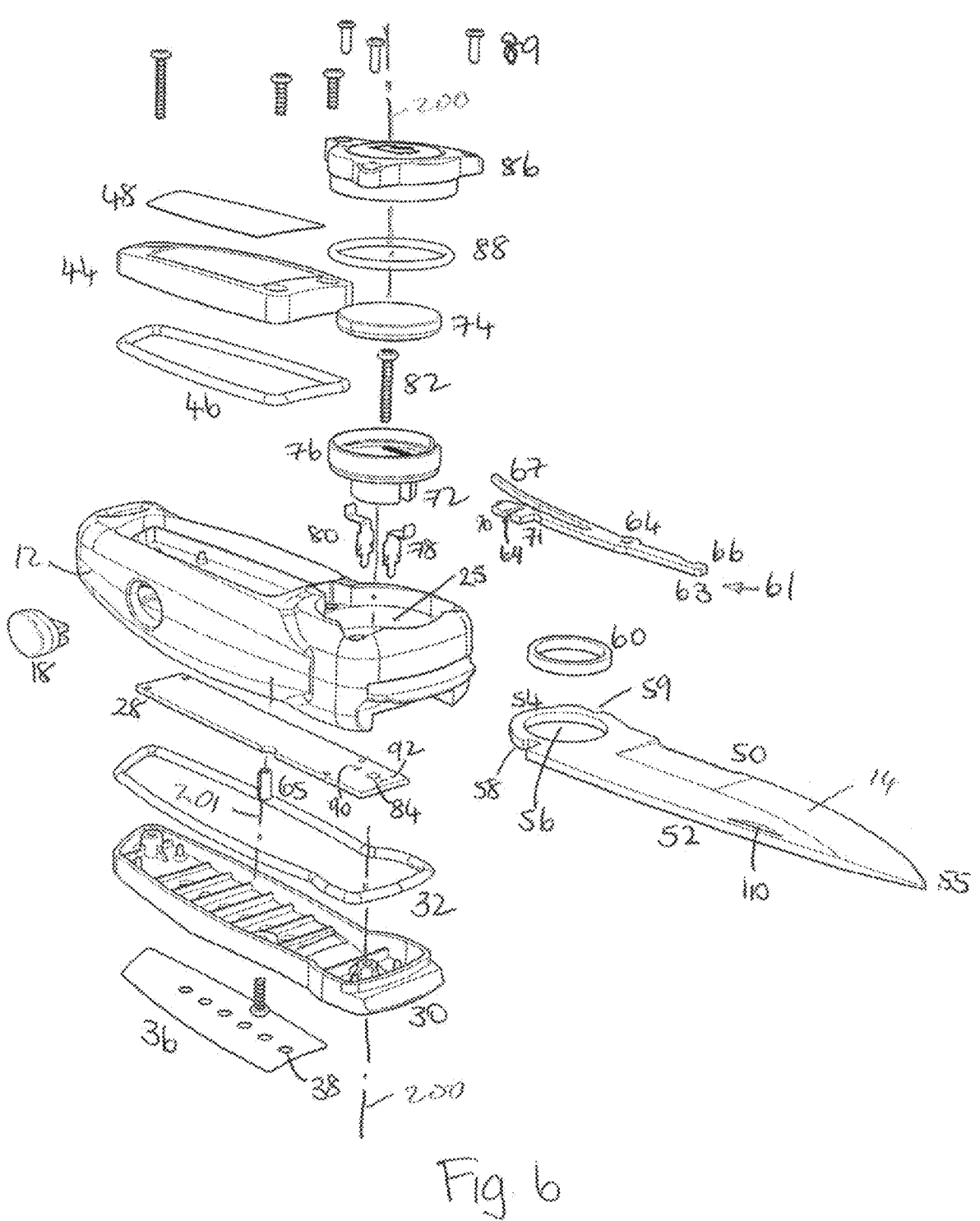
FIG. 6 is an exploded view of the fence tester of the preferred embodiment.
Figure 7:
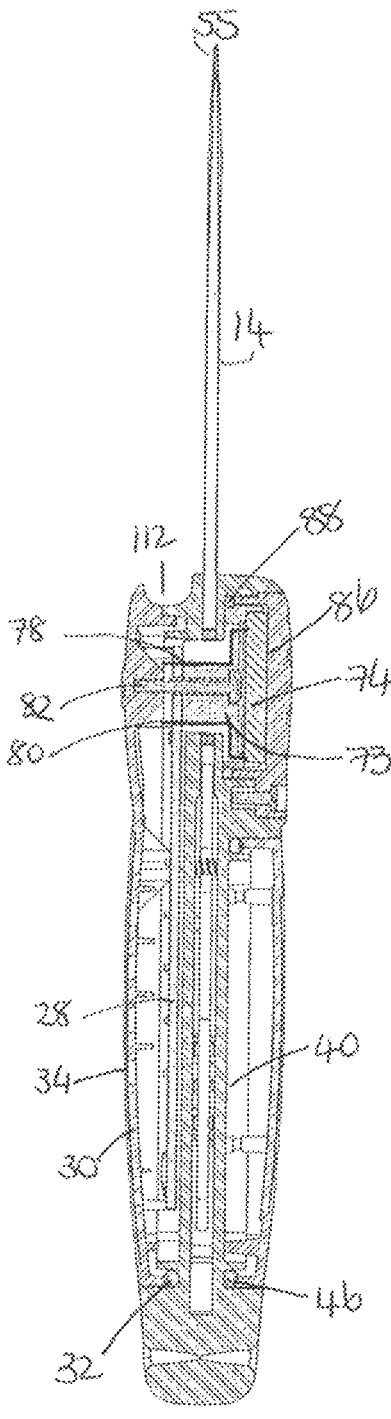
FIG. 7 is a longitudinal cross sectional view of the fence tester of the preferred embodiment in the open state.

Referring to FIG. 4, FIG. 6 and FIG. 7, the upper half 20 of the handle member 12 may comprise a second recess 26 configured to house a voltage detection circuit 28. The fence tester 10 may further comprise a first cover member 30 dimensioned to cover the opening of the second recess 26, thereby protecting the voltage detection circuit 28; and to extend beyond the second recess 26 to cover the pivoting section 16 of the upper half 20 of the handle member 12. The fence tester 10 may further comprise a first seal member 32 dimensioned to match the edges of the upper half 20 of the handle member 12. The first seal member 32 may comprise a silicone foam cord with a round cross section. The first seal member 32 may be mounted around the edges of the upper half 20 of the handle member 12 and arranged to be sandwiched between the edges and the first cover member 30, to form a tight seal therebetween, thereby preventing ingress of water or small particles into the second recess 26 or the interior cavity 25 of the pivoting section 16.

A face of the first cover member 30, may comprise a plurality of apertures 34 whose position is configured so that on mounting of the first cover member 30 over the open end of the second recess 26, the apertures 34 are aligned with light emitter(s) (not shown) of the voltage detection circuit 28, to allow light emitted by the light emitter(s) (not shown) to be seen by a user.

The fence tester 10 may further comprise a first label 36, whose first face (not shown) may be coated with an adhesive material. The first face (not shown) may be configured to be pressed against an outer facing surface of the first cover member 30 so that the adhesive material sticks thereto. The label 36 may comprise a plurality of windows 38 wherein a substrate material of the label 36 is translucent. The windows 38 may be configured to cause them to be aligned with the apertures 34 of the first cover member 30 on adhesion of the label 36 to the outer facing surface of the first cover member 30. An opposing second face (not shown) of the label 36 may comprise a plurality of markings disposed in parallel with the windows 38. In another embodiment, the first cover member 30 may further comprise one or more markings which may be printed or embossed on the outer facing surface thereof, wherein the markings may be disposed in alignment with the apertures 34 of the first cover member 30, to indicate the meaning of light emitted through the apertures 34.

Figure 5:
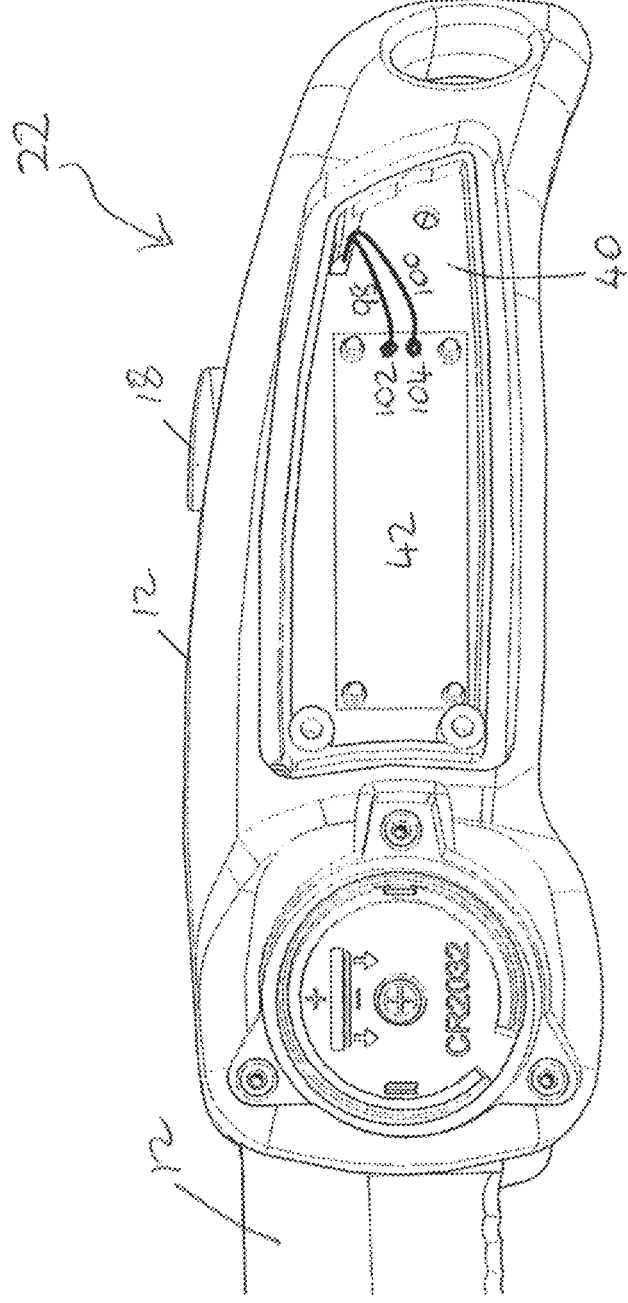
FIG. 5 is a perspective view of the partly disassembled lower half of the fence tester of FIG. 2 with a cover removed therefrom.

Referring to FIG. 5, FIG. 6 and FIG. 7, the lower half 22 of the handle member 12 may comprise a third recess 40 configured to house an alert issuing circuit 42. The voltage detection circuit 28 and the alert issuing circuit 42 will be described in more detail later. The opening of the third recess 40 may be covered by a second cover member 44, thereby protecting the alert issuing circuit 42. The lower half 22 may further comprise a second seal member 46 dimensioned to match the edges of the open end of the third recess 40. The second seal member 46 may comprise a silicone foam cord with a round cross section. The second seal member 46 may be mounted around the edges of the open end of the third recess 40 and arranged to be sandwiched between the edges and the second cover member 44, to form a tight seal therebetween and thereby prevent ingress of water or small particles into the third recess 40. The fence tester 10 may further comprise a second label 48 whose first face (not shown) may be coated with an adhesive material. The first face (not shown) of the label 48 may be configured to be pressed against an outer facing surface of the second cover member 44 so that the adhesive material sticks thereto.

Figure 8:
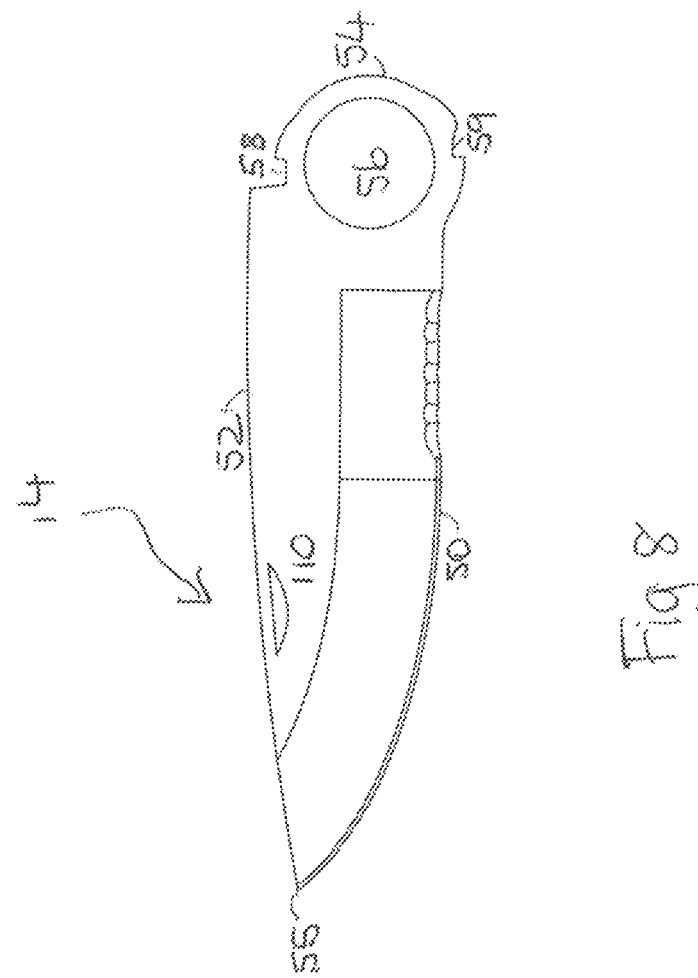
FIG. 8 is a side elevation view of a blade member of the fence tester of the preferred embodiment.

Referring to FIG. 8, the blade member 14 may be formed from an electrically conducting, robust material such as tungsten or steel. However, the skilled person will acknowledge that the preferred embodiment is not limited to either of the above-mentioned metals. On the contrary, the blade member 14 may be formed from any electrically conducting, robust and sharpenable material.

At least one edge of the blade member 14 comprises an arcuate cutting edge 50 and an opposing spine edge 52. The cutting edge 50 may be serrated or smooth. The blade member 14 may comprise an arcuately shaped first end 54 and may progressively taper therefrom towards an opposing pointed end 55.

The blade member 14 may comprise a substantially circular aperture 56 formed at a position slightly spaced from the first end 54. The blade member 14 may also comprise two opposing receiving means, namely, a first receiving means comprising a first groove 58, and a second receiving means comprising a second groove 59 formed at the first end 54 and spaced apart around at least part of the circumference of the aperture 56, for a purpose to be described below. Specifically, the first groove 58 and a second groove 59 may be radially spaced apart so that the first groove 58 is formed in the spine edge 52 and the second groove 59 is substantially colinear with the region of the cutting edge 50 closest to the aperture 56.

The blade member 14 is pivotally coupled to the handle member 12 about a primary pivot axis 200 defined by a pivot member 72, described below, between the open state extending from the handle member 12 and the closed state recessed into the recess 24 of the handle member 12.

Referring to FIG. 6, the interior of the circular aperture 56 may be lined with a ring-shaped blade bush 60. Referring to FIG. 7 and FIG. 8, on assembly, the first end 54 of the blade member 14 and the blade bush 60 may be arranged to be housed within the interior cavity 25 in the pivoting section 16 of the handle member 12. In this configuration, the first end 54 of the blade member 14 and the blade bush 60 are effectively sandwiched between the outer surfaces of the upper half 40 and the lower half 42 of the handle member 12. The blade bush 60 may be configured to closely fit around a flange (not shown) of a battery retainer unit (not shown) of the pivotable coupling mechanism (not shown), to facilitate an at least partial pivoting movement of the blade member 14 relative to the handle member 12.

Figure 9:
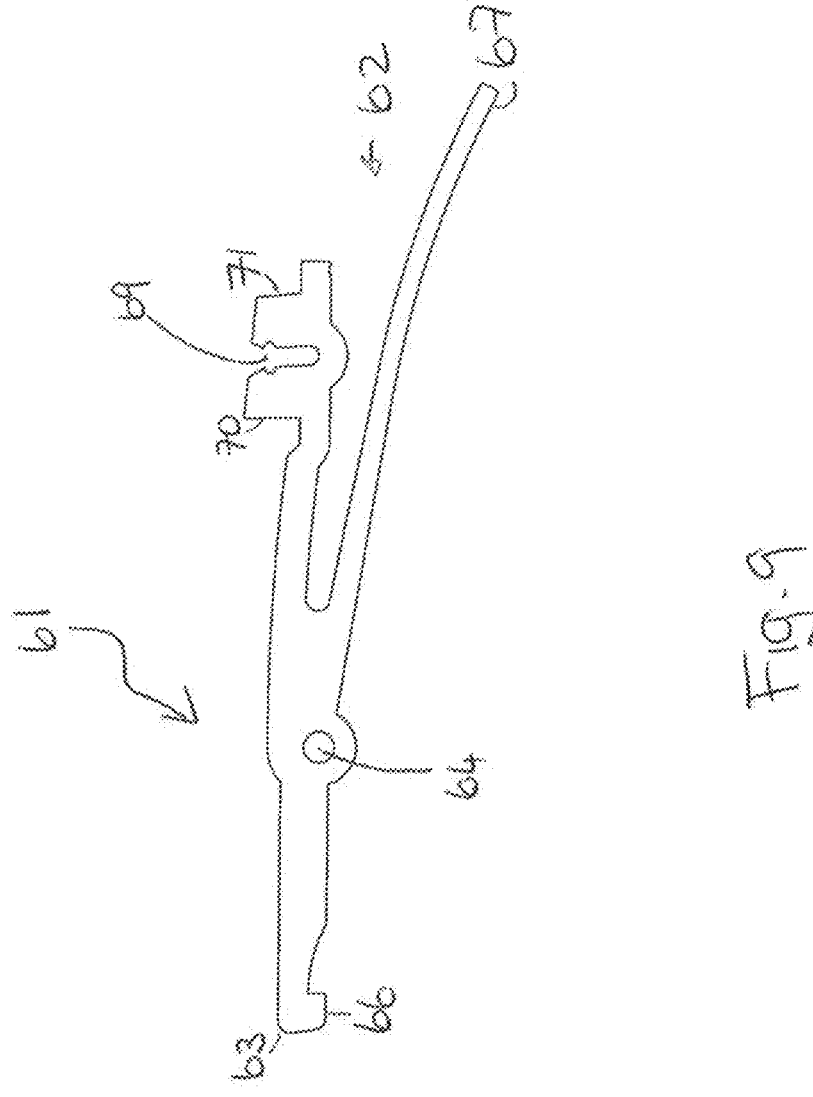
FIG. 9 is a side elevation view of a spring member of the fence tester of the preferred embodiment.

Referring to FIG. 9, a latching element, namely, a spring member 61 latches the blade member 14 in the open state and in the closed state. The spring member 61 may comprise a two-pronged first end 62 and an opposing notched second end 63. The spring member 61 may further comprise an aperture 64 formed at a junction between the two prongs of the first end 62 and the second end 63. Referring to FIG. 6, the spring member 61 may be coupled with the handle member 12 by a pivot pin 65 defining a secondary pivot axis 201. A first end (not shown) of the pivot pin 65 is mountable on an interior surface of a base of the upper half 20 of the handle member 12 so that the rest of the pivot pin 65 projects into the second recess 26 of the handle member 12. The spring member 61 is arranged so that a free end of the pivot pin 65 extends through the aperture 64, thereby allowing the spring member 61 to pivot around the pivot pin 65.

Figure 10:
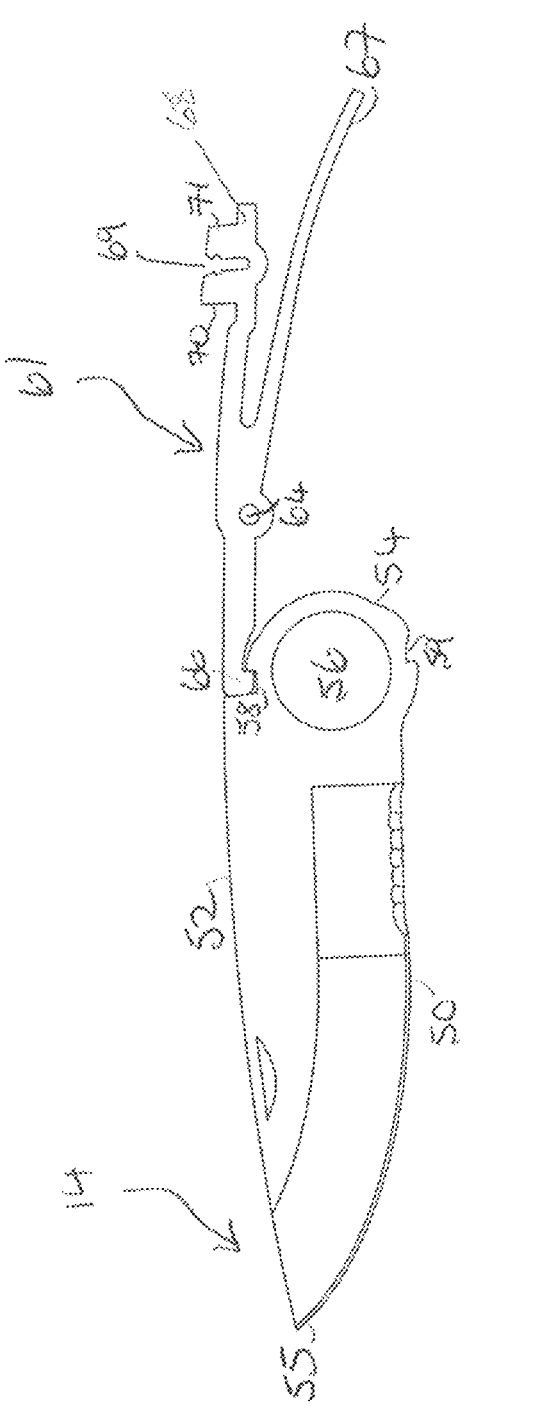
FIG. 10 is a side elevation view of an assembly of the blade member of FIG. 8 and the spring member of FIG. 9 with the blade member in an open state.
Figure 11:
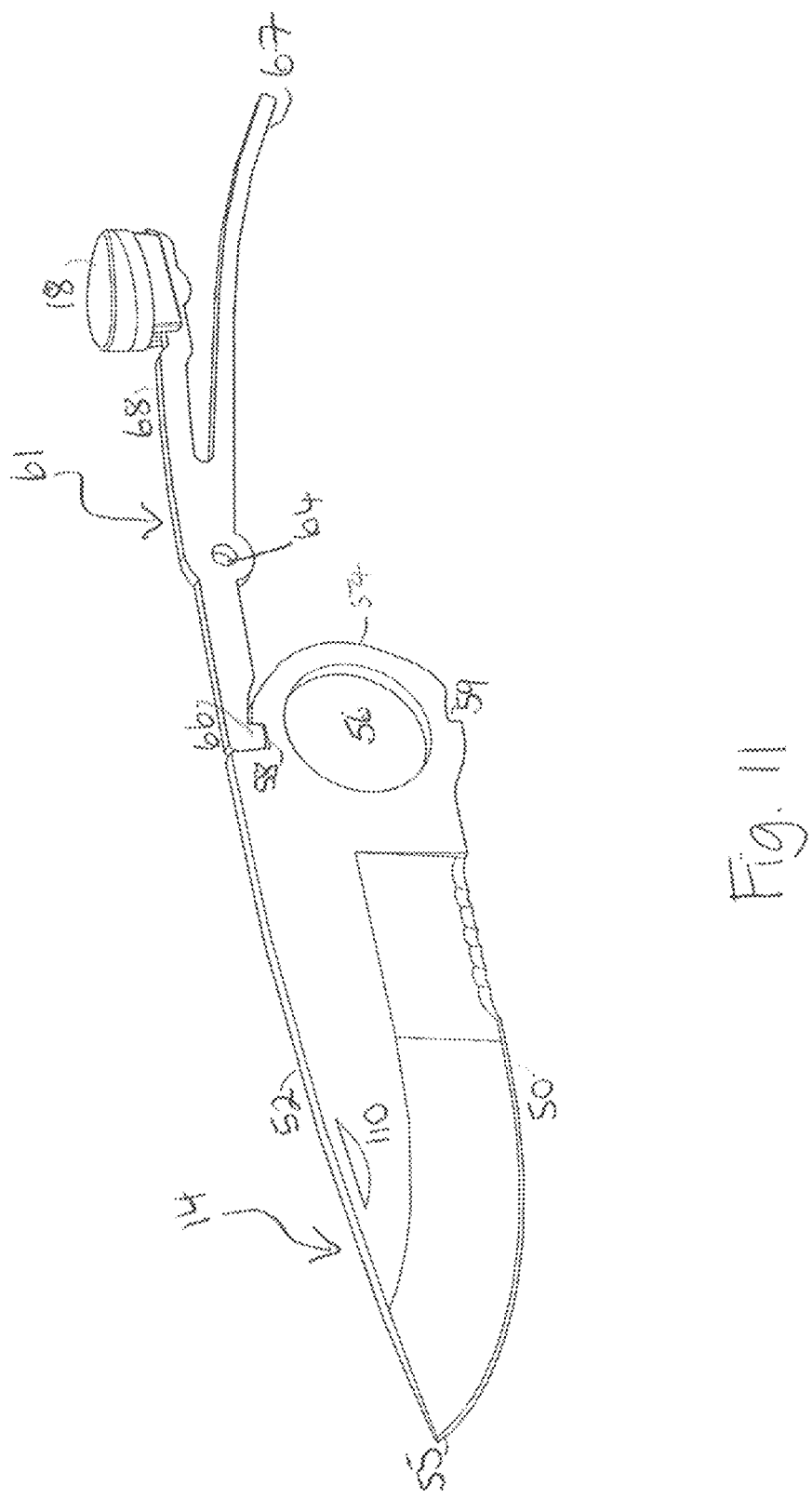
FIG. 11 is a perspective view of an assembly comprising the assembly of FIG. 10 with the spring member coupled with an unlocking button.

Referring to FIG. 10, a toothed notch 66 of the notched second end 63 may be configured to complement the first groove 58 to support the mechanical coupling of the spring member 61 with the blade member 14. A first prong 67 forms a leaf spring for urging the tooth 66 into engagement with the blade member 14 for retaining the blade member 14 in the open and closed states. The first prong 67 of the first end 62 may be arcuately shaped, wherein the curvature thereof substantially matches that of the arcuate cutting edge 50 of the blade member 14. A second prong 68 of the first end 62 may comprise a recess 69 sandwiched between two outwards-facing projections 70, 71 from the second prong 68. Referring to FIG. 11, the outwards-facing projections and the recess of the second prong 68 may be configured with corresponding structures (not shown) on a lower surface of the unlocking button 18 to permit the coupling of the unlocking button 18 with the first end 62 of the spring member 61. The coupling between the spring member 61 and the blade member 14 may stabilise and limit a pivoting movement of the blade member 14 between the open state and the closed, or folded, state relative to the spring member 61.

In the open state of the blade member 14, the toot 66 at the second end 63 of the spring member 61 is engaged in the first receiving means, namely, the first groove 58, thereby locking the blade member 14 into an arrangement whereby its longitudinal axis is co-axially aligned with the longitudinal axis of the spring member 61, so that the blade member 14 extends longitudinally from the spring member 61.

Figure 12:
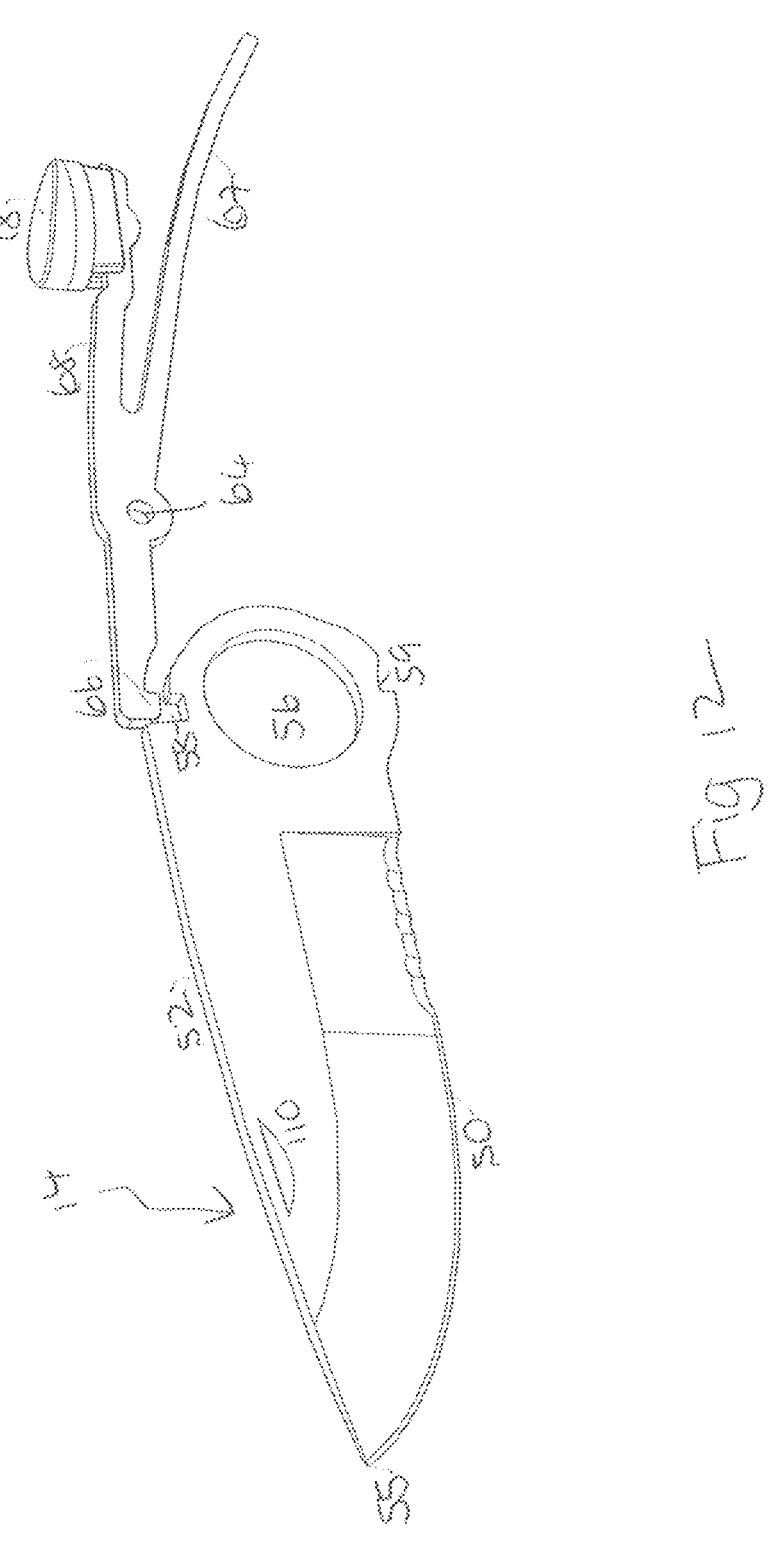
FIG. 12 is a perspective view of the assembly of FIG. 11 with the blade member freed for rotation relative to the spring member.

Referring to FIGS. 10 to 12, depression of the first end 62 of the spring member 61, by for example, depression of the unlocking button 18 causes the toot 66 at the second end 63 of the spring member 61 to disengage the first groove 58. This effectively frees the blade member 14 to be rotated relative to the longitudinal axis of the spring member 61 by the potable coupling mechanism (not shown).

Figure 13:
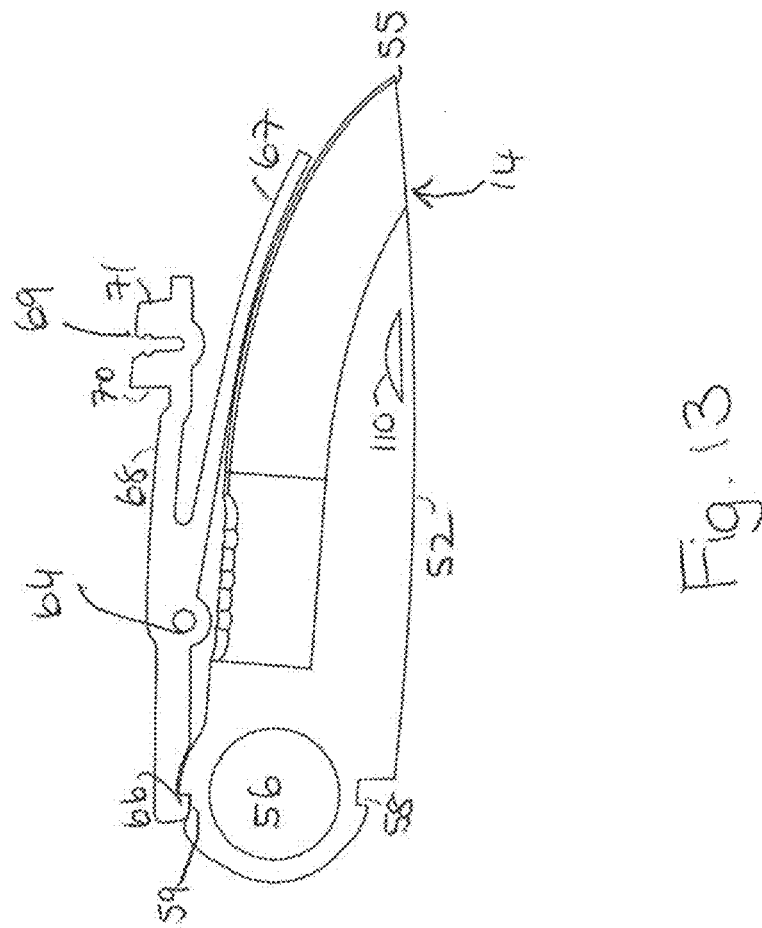
FIG. 13 is a side elevation view of an assembly of the blade member of FIG. 8 and the spring member of FIG. 9 with the blade member in a closed or folded state.

Referring to FIG. 13, the blade member 14 may be rotated relative to the longitudinal axis of the spring member 61 until the second receiving means, namely, the second groove 59 of the blade member 14 is moved to the toot 66 at the second end 63 of the spring member 61. Further rotation of the blade member 14 causes the toot 66 to be moved into and engage with the second groove 59. This causes the blade member 14 to be locked into the folded or closed state with the spring member 61 wherein the arcuate cutting edge 50 of the blade member 14 is rotated to be substantially adjacent to the first prong 67 of the spring member 61.

Figure 14:
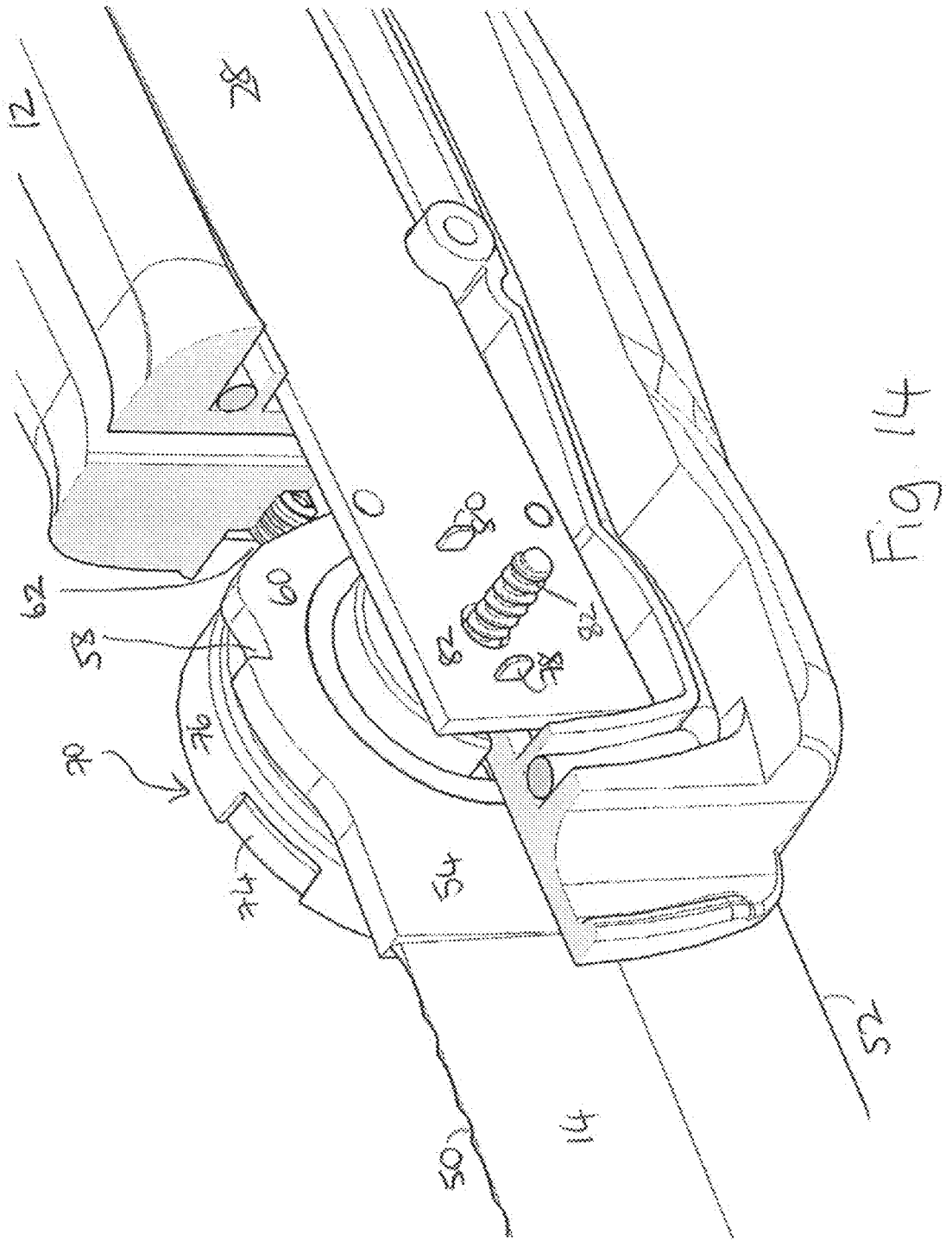
FIG. 14 is a perspective cut-away view of a pivotable coupling mechanism of the fence tester of the preferred embodiment.

Referring to FIG. 14, in use, the spring member 61 may be housed within and traverse the pivoting section (not shown) and the elongate first recess (not shown) of the handle member 12. Accordingly, and further referring to FIG. 1 and FIG. 2, in the open state, the blade member 14 may extend from the pivoting section 16 of the handle member 12 in a substantially coaxial alignment with the handle member 12; with the pointed end 55 of the blade member 14 pointing away from the handle member 12. In the open state, the cutting edge 50 of the blade member 14 may be exposed, enabling a user to cut through materials as required (e.g. undergrowth or excess electrical fencing wire), using the handle member 12 to permit safe handling and grip of the blade member 14.

Figure 15:
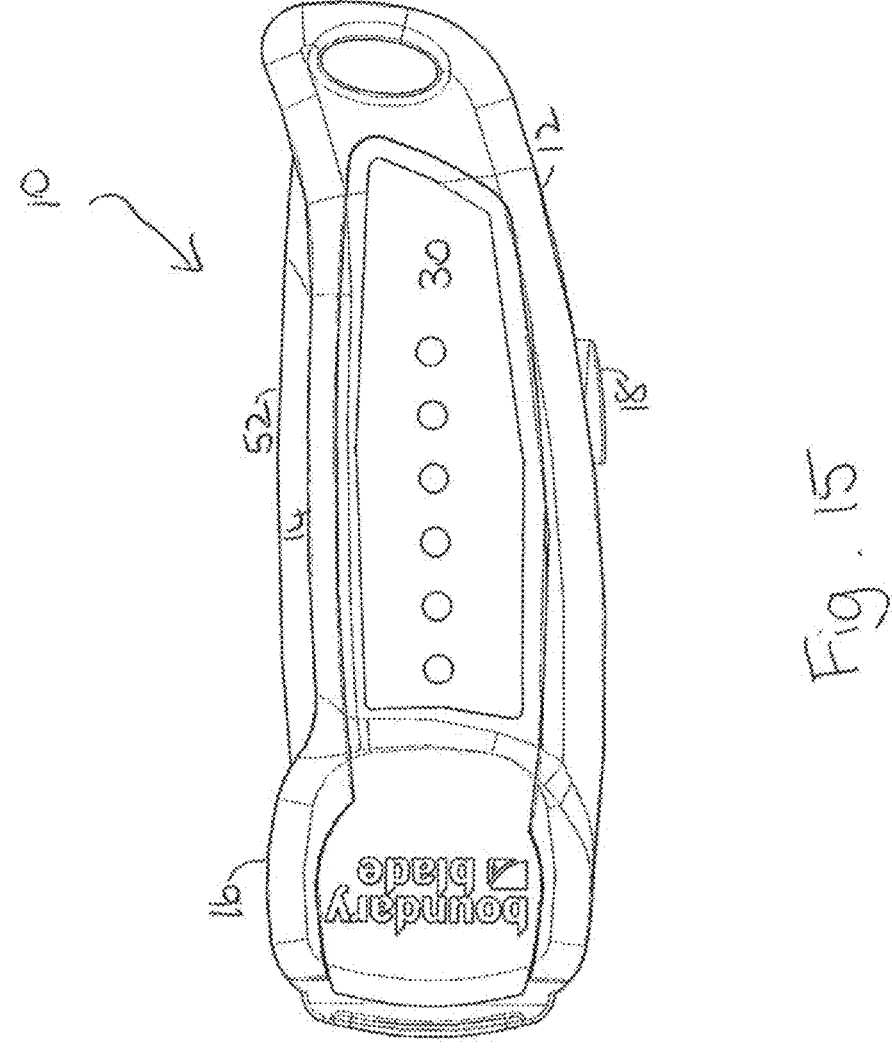
FIG. 15 is a front elevation view of an upper half of the fence tester of the preferred embodiment in a closed state.

Referring to FIG. 15 and FIG. 16 in the closed state, the blade member 14 may be folded in towards the handle member 12 and at least partly housed in the elongate slot-shaped recess (not shown) therein, so that the cutting edge (not shown) and the pointed end (not shown) of the blade member 14 are each directed into the interior of the handle member 12. The spine edge 52 of the blade member 14 may not be housed in the elongate slot-shaped recess (not shown) of the handle member 12 and may at least partially project therefrom so that the spine edge 52 is exposed to the user. A notch 110 may be formed in the surface of at least one face of the blade member 14 at a position beside the spine edge 52, to provide purchase for a user to pull the blade member 14 from the recess (not shown) in the handle member 12 and into the open state.

Returning to FIG. 8 and FIG. 9, on the pulling of the blade member 14 into the open state, the blade member 14 is locked in this state until depression of the unlocking button 18 mounted on the side of the handle member 12 causes the tooth 66 of the spring member 61 to disengage the first groove 58 in the blade member 14 thereby releasing the blade member 14 so that it may be rotated by approximately 180 degrees and locked into the closed state. Rotation of the blade member 14 into the closed state and the consequent folding of the blade member 14 into the recess (not shown) in the handle member 12, permits the fence tester 10 to be safely and conveniently carried in the user's pocket when not in use.

Referring to FIG. 6, FIG. 7 and FIG. 14, the pivot coupling mechanism for pivotally coupling the blade member 14 to the handle member 12 comprises a pivot member 72 which defines the primary pivot axis 200 about which the blade member 14 is pivotal relative to the handle member 12. A cup-shaped battery retainer unit 73 is located on one end of the pivot member 72 defining a recess for housing a battery 74. The recess of the battery retainer unit 73 may be dimensioned to accommodate a CR2032 battery 74. The skilled person will acknowledge that the above-mentioned CR2032 battery is provided for illustration purposes only. In particular, the skilled person will understand that the fence tester of the preferred embodiment is not limited to the use of a CR2032 battery. On the contrary, the fence tester of the preferred embodiment is operable with any small, light-weight battery capable of delivering sufficient electricity to two circuits simultaneously.

The battery retainer unit 73 may comprise a flange 76 disposed at the open end of the battery retainer unit 73. The flange 76 may be of greater external diameter than the rest of the battery retainer unit 73 and may be configured to form a close fit with the interior aperture of the blade bush 30. Accordingly, the closed end of the battery retainer unit 73 may be effectively inserted through the interior aperture of the blade bush 30 until the flange 76 of the battery retainer unit 73 is reached, at which point, the close fit of the flange 76 with the interior aperture of the blade bush 30 prevents further movement of the battery retainer unit 73 through the interior aperture of the blade bush 30. In this way, on assembly, the battery retainer unit 73 and the blade bush 30 are effectively sandwiched between the outer surfaces of the upper half 40 and the lower half 42 of the handle member 12 at the pivoting section 16 thereof. In particular, the battery retainer unit 73 may traverse the upper half 20 and the lower half 22 of the handle member 12 through the internal cavity 25 of the pivoting section 16. This arrangement further allows for an at least partial pivoting movement of the blade member 14 between the open state and the closed or folded state relative to the handle member 12.

Returning to FIG. 6 and FIG. 14, the walls of the battery retainer unit 73 may comprise two slots (not shown) formed between the closed end of the battery retainer unit 73 and the flange 76. The two slots (not shown) may be separated by approximately 180 degrees, so that they are effectively disposed on either side of the battery retainer unit 73. Two metal probes 78, 80 may be embedded in the two slots (not shown) in the walls of the battery retainer unit 73. The slots (not shown) may extend from the closed end of the battery retainer unit 73 to the flange 76 thereof.

A first end of the probes 78, 80 may each be positioned to extend through the slots (not shown) to physically touch corresponding battery pads (not shown) of the battery 74. Specifically, the first end of the first probe 78 may be arranged to press against a bottom face of the battery 74 which has a negative polarity. Similarly, the first end of the second probe 80 may be arranged to press against a side of the battery 74 which has a positive polarity.

The closed end of the battery retainer unit 73 may further comprise a recessed aperture (not shown) formed in the inner face thereof. The recessed aperture (not shown) may be configured to accommodate a battery retainer screw 82. A first end of the battery retainer screw 82 may be threaded through the recessed aperture (not shown) from the inner face to the outer face of the closed end of the battery retainer unit 73 and thence to the first cover member 30 at the pivoting section 16 of the upper half 20 of the handle member 12. Accordingly, the battery retainer screw 82 may mechanically couple the battery retainer unit 73 to the first cover member 30. Furthermore, the opposing second end of the battery retainer screw 82 may be recessed from the battery 74, so that the battery retainer screw 82 does not touch the battery 74.

The opening of the battery retainer unit 73 may be covered by a third cover member 86, thereby protecting the battery 74 housed within the battery retainer unit 73. The pivot member 72 of the fence tester 10 may further comprise a substantially ring-shaped third seal member 88 dimensioned to match the outer edges of the open end of the battery retainer unit 73. The third seal member 88 may be stretched around the outer edges of the open end of the battery retainer unit 73 and arranged to be sandwiched between the edges and the cover member 86, to form a tight seal therebetween and thereby prevent ingress of water or small particles to the battery 74 or the first end of the probes 78, 80. The third cover member 86 may be mechanically coupled with the pivoting section 16 of the handle member 12 by a plurality of screwing members 89.

To ensure the formation of tight seals, the or each of the first, second and third seal members 32, 46, 88 may be formed from a deformable waterproof material such as silicone foam rubber or nitrile rubber. Similarly, the or each of the first cover member 32, the second cover member 46, the third cover member 88 and the handle member 12, may be formed from a waterproof plastics material such as polyethylene (PE), polypropylene, acetal, acrylic nylon, polystyrene, polyvinyl chloride (PVC), acrylonitrile butadiene styrene (ABS) and polycarbonate.

The second end of each of the probes 78, 80 may extend through the pivot member 72 to pass through two apertures 90, 92 disposed at one end of a printed circuit board (PCB) of the voltage detection circuit 28 and align with corresponding two mounting pads (not shown) of the voltage detection circuit 28. The second end of each of the probes 78, 80 may be each soldered to the corresponding two mounting pads (not shown) to form an electrical connection with the voltage detection circuit 28.

Thus, the configuration and arrangement of elements in the pivot coupling mechanism including the pivot member 72 of the fence tester 10 may ensure that the electrical connections between the battery 74 and the printed circuit board (PCB) of the voltage detection circuit 28 goes through the centre of the mechanical blade pivoting mechanism. As a result, and in contrast with other prior art mechanical blade pivoting mechanisms, the electrical connections in the preferred embodiment are isolated from the outside elements; and protected from water ingress. By contrast, electrical connections in traditional mechanical blade pivoting mechanisms are exposed to the elements and as a result become rapidly corroded. Thus, traditional mechanical blade pivoting mechanisms require frequent repairs to replace the corroded electrical connections. By protecting electrical connections from the elements, the fence tester of the preferred embodiment overcomes this problem, thereby increasing its useful life.

Figure 17:
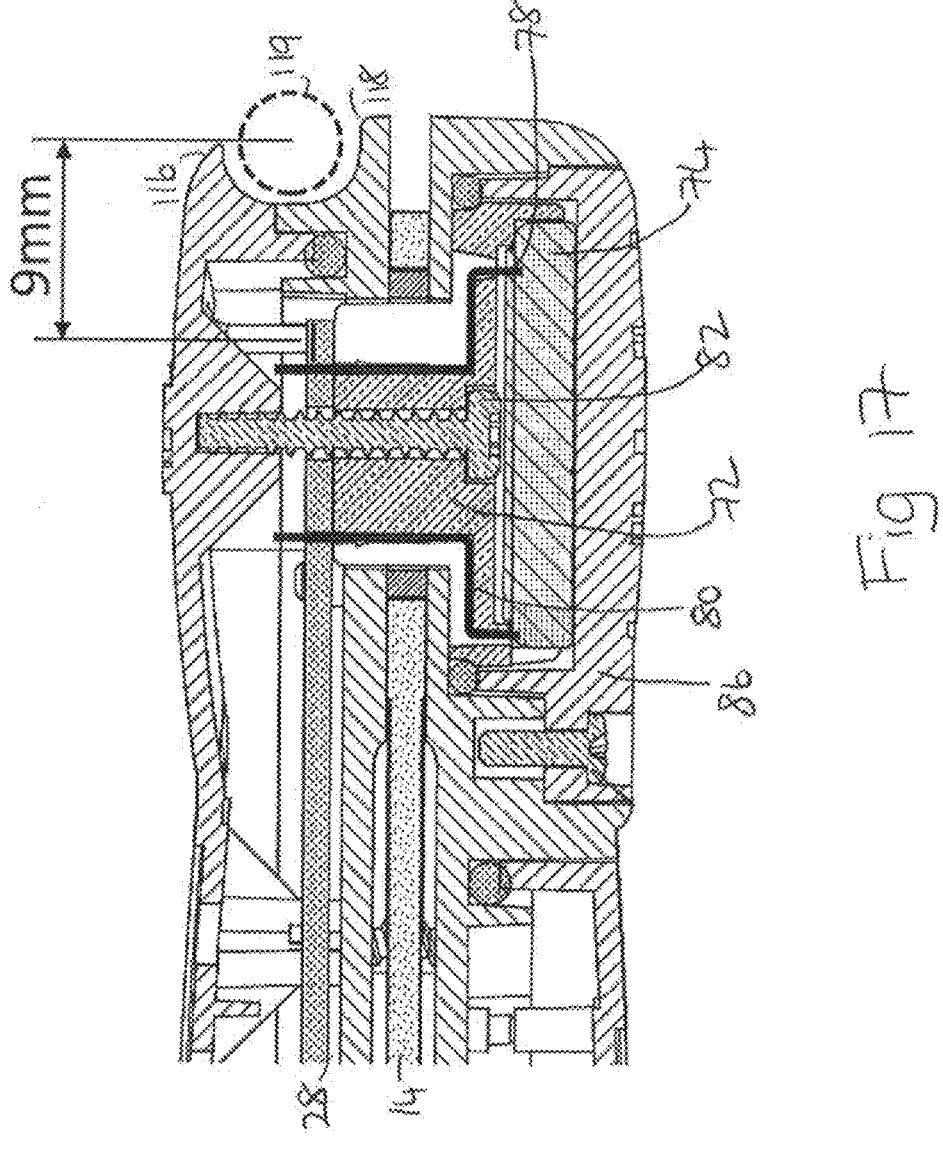
FIG. 17 is a transverse cross sectional view of a bulbous pivoting section of a handle member of the fence tester showing a fence detector circuit housed within the upper half of the handle member.

Referring to FIG. 3, FIG. 7 and FIG. 17, an end of the first cover member 30 corresponding with the outer edge of the pivoting section 16 of the handle member 12 may comprise a hooking member 112 formed from an indent 114 in the first cover member 30. The indent's 114 extremities may be embraced by an overhanging pointed region 116 and an opposing flat-topped projection 118. The indent 114 may be dimensioned to house an external diameter of an electrical fencing wire 119. The hooking member 112 may be spaced apart from the elongated slot-shaped first recess 24 in the handle member 12 to prevent an electrical fencing wire housed in the indent 114 from the touching the blade member (not shown) when it is extended in the open state. However, ideally, the process of positioning of the hooking member 112 around an electrical fencing wire 119 would only be done following retraction of the blade member (not shown) into the first recess 24 to prevent accidental touching of the blade member (not shown) with the electrical fencing wire 119 while adjusting the position the hooking member 112. Accordingly, using either or both of these measures, the blade member (not shown) is not permitted to touch the electrical fencing wire 119, thereby protecting the user from receiving an electric shock from the electrical fencing wire 119. Thus, the fence tester of the preferred embodiment is operable regardless of whether the blade member (not shown) is in the open state or the closed state.

The indent 114 may be further configured so that its centre, and the centre of an electrical fencing wire (not shown) housed in the indent 114 is distanced by 9 mm from an antenna PCB trace (not shown) of the voltage detection circuit 28 housed within the upper half 20 of the handle member 12. The distance between the centre of the indent 114 and the antenna PCB trace (not shown) of the voltage detection circuit 28 is configured to ensure reliable detection and accurate measurement by the voltage detection circuit 28 of the positive voltage peaks of all makes and models of fencing wires 119. The voltage detection circuit 28 and the antenna PCB trace thereof will be described in more detail later.

The skilled person will acknowledge that the above-mentioned value for the spacing of the centre of the indent 114 from the antenna of the voltage detection circuit 28 is provided for illustration purposes only. In particular, the skilled person will acknowledge that the fence tester of the preferred embodiment is not limited to this value for the spacing of the centre of the indent 114 from the antenna of the voltage detection circuit 28. On the contrary, the fence tester of the preferred embodiment is operable with any spacing between the centre of the indent 114 and the antenna of the voltage detection circuit 28 to permit reliable detection and accurate measurements of the positive voltage peaks of electrical fencing wires 119 in accordance with the geometry of the fence tester and its hooking member.

Referring to FIG. 4 and FIG. 5, the printed circuit board of the voltage detection circuit 28 may comprise a further two circuit board pads 94, 96 disposed at the opposite end of the printed circuit board 28 to that where its mounting pads (not shown) are soldered to the second end of each of the probes 78, 80. The two circuit board pads of the voltage detection circuit 28 may be electrically coupled with two wires 98, 100. The two wires 98, 100 may be threaded through an opening (not shown) in the upper half of the handle member 12 and a corresponding opening in the lower half 42 of the handle member 12 to permit access for the wires 98, 100 to two circuit board pads 102, 104 of the alert issuing circuit 42. The wires 98, 100 may be soldered to the two circuit board pads 102, 104 of the alert issuing circuit 42. Thus, with this arrangement of wires 98, 100 threaded between corresponding openings in the upper half and the lower half 22 of the handle member 12; and soldered to circuit board pads 94, 96, 102, 104, the alert issuing circuit 42 is electrically daisy-chained to the voltage detection circuit 28, so that the single battery 74 may power both the voltage detection circuit 28 and the alert issuing circuit 42.

Referring to FIG. 4 and FIG. 14, because of its connection to the battery 74 through the pivotable coupling mechanism 72 of the fence tester 10, the voltage detection circuit 28 may be continuously powered while the battery 74 remains charged.

Referring to FIG. 4, FIG. 14 and FIG. 17, the voltage detection circuit 28 may comprise an antenna (not shown) constructed as a printed circuit board trace 200 printed at the edge of the printed circuit board on which the voltage detection circuit 28 is formed. The antenna (not shown) may be configured to detect a voltage pulse of a high voltage electrical fencing wire (not shown) retained in the hooking member 112. The voltage of a live electrical fencing wire has a narrow pulsatile shark-fin profile of typically 250 to 300 μsec duration. The voltages are typically around 5-20 kV. The output from an electrical fencing wire may be constrained or unconstrained. An unconstrained output is a repeating sequence of positive and negative voltage pulses. The voltage pulses cause an alternating current to flow through the electrical fencing wire (not shown).

The alternating current flowing through the electrical fencing wire (not shown) causes a magnetic field to be generated around the electrical fencing wire (not shown). The magnetic field spreads from the electrical fencing wire (not shown) and on reaching the antenna (not shown) of the voltage detection circuit 28, the magnetic field induces a current in the antenna (not shown). Since the antenna (not shown) has a resistance, the current flowing in the antenna (not shown) causes a voltage drop across it. The voltage dropped across the antenna (not shown) is proportional to the voltage of the electrical fencing wire (not shown).

The antenna (not shown) of the voltage detection circuit 28 may be coupled with an operational amplifier-based peak detector (not shown) which comprises a 1 μF peak detector capacitor (not shown) coupled to a bleed off resistor (not shown). The voltage dropped across the antenna (not shown) may be applied to the peak detector capacitor (not shown) to cause it to become charged and its voltage to increase. The voltage of the peak detector capacitor (not shown) may be sampled by a microcontroller unit (not shown) of the voltage detection circuit 28 while at the same time, the charge held by the peak detector capacitor (not shown) may be progressively drained therefrom by the bleed off resistor (not shown) which is coupled to a ground voltage (0V) line (not shown) of the voltage detection circuit 28. The peak detector capacitor (not shown) and the bleed off resistor (not shown) may each be configured to cause the peak detector capacitor (not shown) to retain its charge for sufficient duration to allow the microcontroller unit (not shown) to sample the corresponding voltage of the peak detector capacitor (not shown), while allowing the peak detector capacitor (not shown) to become discharged before the issuance of the next voltage pulse by the electrical fencing wire (not shown).

Accordingly, the antenna and operational-amplifier peak may capture the electric fence voltage profile and step it down to a voltage that will not destroy the 3.3V components of the microcontroller unit (not shown).

To prolong the life of the battery 74, the default operational mode of the microcontroller unit (not shown) of the voltage detection circuit 28 is a sleep mode whose current consumption is less than 1 μA. During sleep mode, all or most of the sub-modules of the microcontroller unit (not shown), such as its Analog to Digital Converters, Brown-Out Detectors, and CPU may be disabled through the setting of corresponding bits in the registers of the microcontroller unit (not shown) to a disabled state. For brevity, these bits in the microcontroller unit registers will be referred to henceforth as "sub-module register bits".

The sampled voltage of the peak detector capacitor (not shown) may be presented to a comparator circuit (not shown). The comparator circuit (not shown) may comprise a resistor divider configured to create a 1.1 V voltage reference with which the sampled voltage is compared. The 1.1 V voltage reference may be set using register bits within the microcontroller unit (not shown). The reference voltage of 1.1V is less than the 2.0V fully discharged voltage of the battery (not shown), since for safety and to ensure continuity of operation, it is important that the voltage detection circuit 28 be operable across the entire voltage range of the battery (not shown) with some additional operational scope for the issuance of a low battery alert before the battery (not shown) is fully discharged.

Should the sampled voltage exceed the voltage reference, it indicates that the fence tester is positioned so that a live electrical fencing wire (not shown) is housed within the hooking member (not shown) of the fence tester. In response, the voltage detection circuit 28 may be configured to issue an interrupt pulse signal (INT) on an interrupt signal line (not shown) from the comparator circuit (not shown).

The microcontroller unit may be configured to monitor an interrupt port thereof coupled with the interrupt signal line to detect the presence of an interrupt pulse signal (INT). On detection of a rising edge of an interrupt pulse on the interrupt signal line, the microcontroller unit may be configured to reset its sub-module register bits to an activated state. This may cause the microcontroller unit sub-modules, including its analogue to digital converters to become activated; and thereby allow access to all of the microcontroller unit functionality. Thus, the microcontroller unit (not shown) may be effectively awakened on the positioning of the fence detector (not shown) to cause a live electrical fencing wire (not shown) to be housed within the hooking member (not shown) of the fence detector (not shown).

The sampled voltage of the peak detector capacitor (not shown) may be presented to an analogue to digital input (not shown) of the microcontroller unit (not shown). The microcontroller unit (not shown) may comprise polynomial equation(s) characterising the relationship between a received voltage and a voltage of an electrical fencing wire (not shown) retained in the hooking member 112. The microcontroller unit (not shown) may be configured to apply the polynomial equation(s) to the presented voltage peak detector capacitor (not shown) to calculate the corresponding voltage of the electrical fencing wire (not shown) in question. The microcontroller unit (not shown) may be further configured to activate and cause one of a plurality of light emitting diodes (LEDs) (not shown) or other suitable light emitting device of the voltage detection circuit 28 to be illuminated according to the value of the calculated voltage.

In one embodiment, the LEDs (not shown) may be arranged so that
a first LED (not shown) is activated if the calculated voltage is less than 2.2V;
a second LED (not shown) is activated if the calculated voltage is substantially equal to 1.0 kV;
a third LED (not shown) is activated if the calculated voltage is substantially equal to 2.5 kV;
a fourth LED (not shown) is activated if the calculated voltage is substantially equal to 4.0 kV;
a fifth LED (not shown) is activated if the calculated voltage is substantially equal to 6.0 kV; and
a sixth LED (not shown) is activated if the calculated voltage is substantially equal to 8.0 kV.
The skilled person will acknowledge that the above-mentioned voltage values are provided for illustration purposes only. In particular, the skilled person will acknowledge that the fence tester of the preferred embodiment is not limited to these voltage values. On the contrary, the fence tester of the preferred embodiment is operable to provide an indication of any required voltage measurement according to the design of the voltage detection circuit 28. On illumination of an LED, the voltage detection circuit 28 is configured to re-enter its default low current consumption sleep mode.

In another embodiment the LEDs (not shown) may comprise an additional Low Battery LED (not shown) which is illuminated in the event the battery (not shown) powering the voltage detection circuit 28 and the alert issuing circuit (not shown) is charged to below a pre-defined threshold, as will be discussed later.

As the voltage detection circuit 28 and the antenna (not shown) thereof may be housed within the upper half 20 of the handle member 12, the antenna (not shown) may be electrically isolated from the electrical fencing wire (not shown) by the plastics material of the handle member 12 and the first cover member 30. Thus, the antenna (not shown) acts as non-invasive measurement sensor and there is no connection between the ground voltage (0V) line of the voltage detection circuit 28 and the grounding system of the electrical fencing wire. In particular, the voltage detection circuit 28 and the electrical fencing circuit are independent circuits and there is no way for a user of the fence tester 10 to be affected by the high voltage of an electrical fencing wire retained within the hooking member 112 of the fence tester 10.

The fence tester of the preferred embodiment may use the Sigfox network to generate and transmit geographical coordinates to enable the location of a user to be determined in the event the user is in distress, hurt or trapped. Since both the fence detector circuit and the alert issuing circuit may be powered from the same single power source, namely the battery (not shown), the fence tester may use optimised power management approaches to minimise the power consumption of both circuits and thereby maximise the operational lifetime of the battery (not shown).

Figure 18:
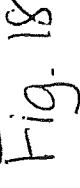
FIG. 18 is a block diagram of an alert issuing circuit of the fence tester of the preferred embodiment.
Figure 19:
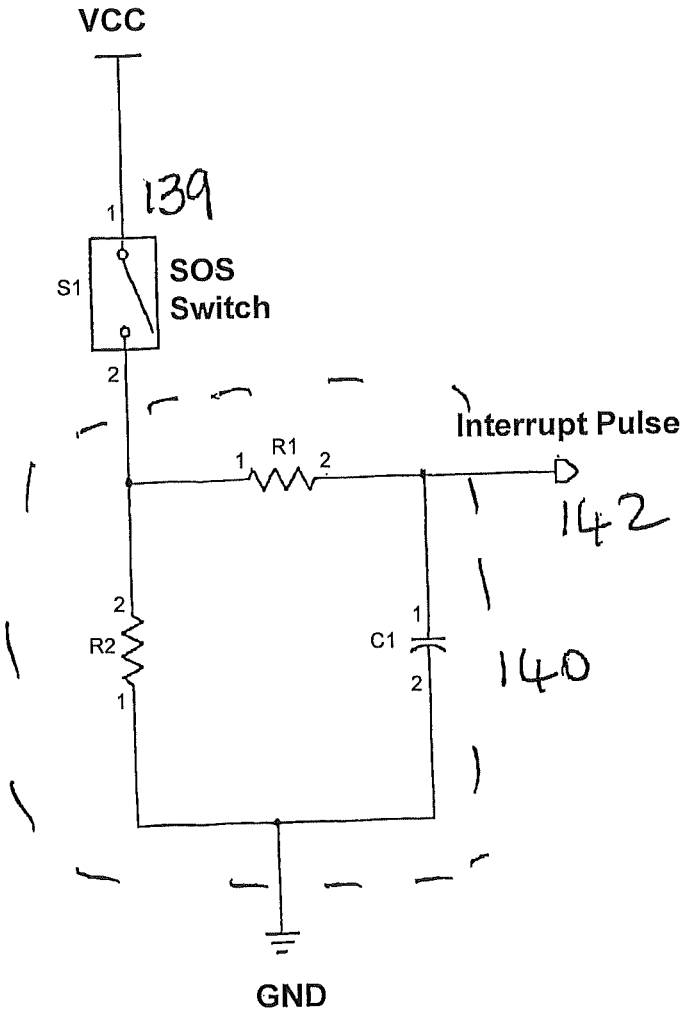

Referring to FIG. 18, the alert issuing circuit 42 may comprise a low power, high performance Microchip Cortex MO microcontroller unit 120 coupled with a Sigfox Transmitter integrated circuit 122 through corresponding serial peripheral interface (SPI) ports 124, 126 and 128, 130 to generate and send a predefined alert data packets to a Sigfox server (not shown). In particular, the microcontroller unit 120 may comprise interrupt port(s) (not shown), at least one of which is coupled with a corresponding interrupt signal line of a de-bounce circuit (not shown). The de-bounce circuit (not shown) may be coupled in turn to an SOS panic button 128 of the fence tester.

Figure 20:
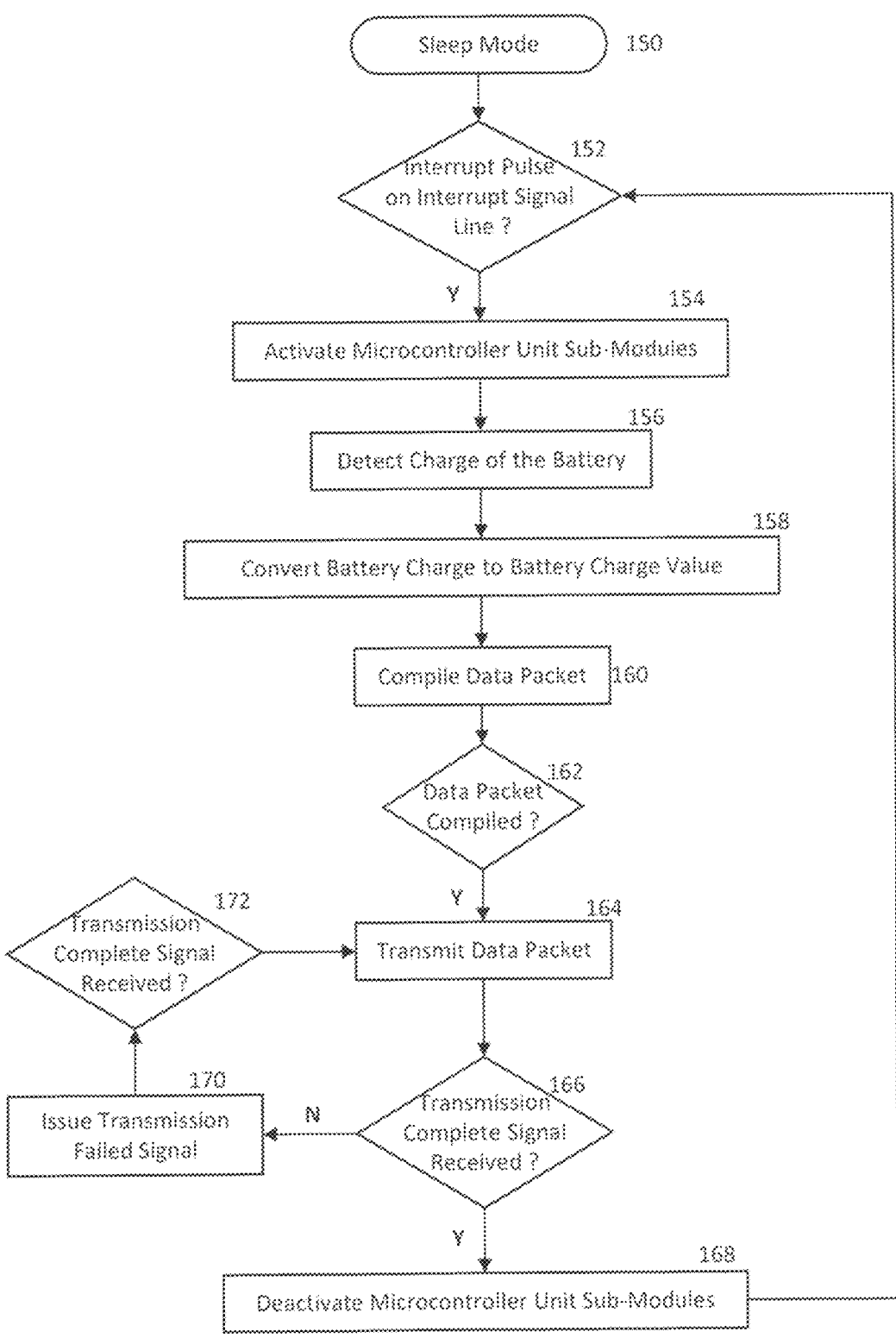
FIG. 20 is a flow chart of an algorithm implemented in the alert issuing circuit of the fence tester of the preferred embodiment.

Referring to FIG. 20 and FIG. 18, the default operational mode of the alert issuing circuit 42 may be a sleep mode 150 whose current consumption is less than 1 μA. During sleep mode, all or most of the sub-modules of the microcontroller unit 120, such as the such as its Analog to Digital Converters, Brown-Out Detectors, and CPU may be disabled through the setting of corresponding bits in the registers of the microcontroller unit 120 to a disabled state. For brevity, these bits in the microcontroller unit registers will be referred to henceforth as "sub-module register 15 bits".

Figure 19:
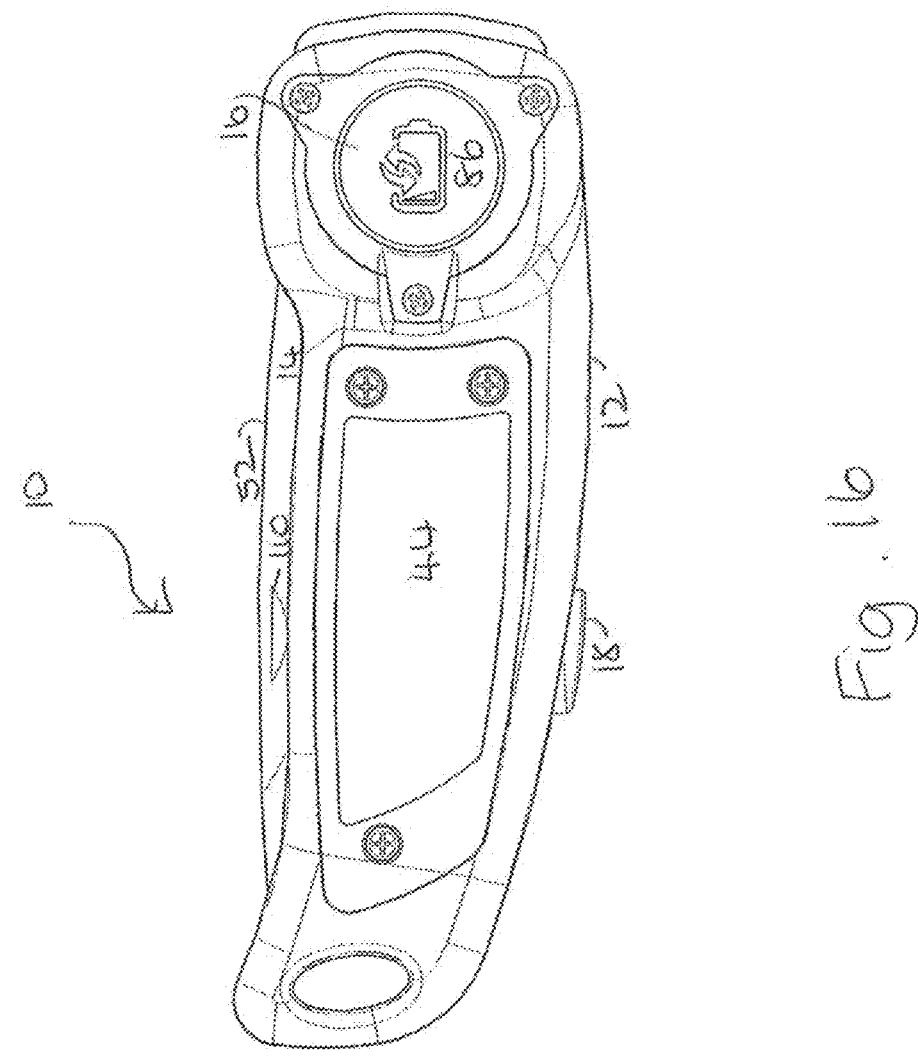
FIG. 19 is a circuit diagram of a mechanical switch interrupt pin interface of the alert issuing circuit of FIG. 14.

Referring to FIG. 19, an interrupt pulse line 142 of the de-bounce circuit 140 may be set to 0V through resistor R2. On depression of the SOS panic button 128, a switch 139 whose default state is open and is coupled with the SOS panic button 128 may be closed. This may cause the setting a junction of the resistors R1 and R2 to a high voltage state of 3.3V. The signal may be smoothed by the charge time of resistor R1 and capacitor C1, to generate a rectangular interrupt pulse signal (INT) on the interrupt pulse line of the de-bounce circuit 140.

Referring to FIG. 18, FIG. 19 and FIG. 20, the micro-controller unit 120 may be configured to monitor its inter-rupt port coupled with the interrupt signal line of the de-bounce circuit for the presence of an interrupt pulse signal (INT). On detection 152 of a rising edge of an interrupt pulse on the interrupt signal line, the microcon-troller unit 120 may be configured to reset its sub-module register bits to an activated state. This may cause the microcontroller unit 120 sub-modules, including its ana-logue to digital converters to become activated 154; thereby allowing access to all of the microcontroller unit 120 func-tionality. Thus, in essence the microcontroller unit 120 may monitor the SOS panic button 128 and waken the Sigfox Transmitter integrated circuit 122 on depression of the SOS panic button 128. In the absence of the de-bounce circuit 140, the microcontroller unit 120 would otherwise detect multiple interrupt edges on account of the noisy activity of the switch 139.

Since the battery 132 may slowly discharge on activation of the microcontroller unit 120 sub-modules, the microcon-troller unit 120 may be configured to detect 156 the charge of the battery 132 on activation of the microcontroller unit's analogue to digital converters. The microcontroller unit 120 may be configured to convert 158 the detected battery charge into an integer valued between 0 to 10. For brevity, this integer will be referred to henceforth as the "battery charge value". Accordingly, the battery charge value details the extent to which the battery 132 is charged and how long until it must be replaced. The microcontroller unit 120 may be configured to store the battery charge value in the micro-controller unit memory. On conversion of the detected battery charge into the battery charge value, a software flag may be updated to a value indicating that the battery charge calculations are completed.

On receipt of the updated software flag, the microcon-troller unit 120 may be configured to compile 160 a 12 byte data packet comprising the following:

a device identifier code, which is a unique identification
        code of each fence tester stored in an electrically
        erasable programmable read-only memory (EEPROM)
        of the microcontroller unit 120;
    the battery charge value;
    geolocation information comprising the GPS co-ordinates
        of the fence tester (not shown) established from trian-
        gulation data extracted from a plurality of Sigfox
        receiver towers (not shown) located closest to the fence
        tester (not shown).

The microcontroller unit 120 may be configured to wait until the battery charge is detected and the data packet compiled 162 before updating a further internal software flag to a value indicating that the data packet is ready for transmission.

On receipt of the updated further software flag, the microcontroller unit 120 may be configured to transmit 164 the assembled data packet to the Sigfox Transmitter inte-grated circuit 122 through the microcontroller unit's SPI interface port. The Sigfox Transmitter integrated circuit 122 may be configured to transmit the received data packet to the Sigfox network. On completion of transmission of the data packet to the Sigfox network and receipt by the Sigfox Transmitter integrated circuit 122 of a corresponding acknowledgement of received data packet signal from the Sigfox network, the Sigfox Transmitter integrated circuit 122 may be configured to issue a transmission complete signal to the microcontroller unit 120 through the SPI port. On receipt 166 of the transmission complete signal, the microcontroller unit 120 may be configured to reset its sub-module register bits to a disabled state. This may cause the microcontroller unit 120 sub-modules, including its analogue to digital converters to become deactivated 168, thereby disabling access to all of the microcontroller unit 120 functionality. Accordingly, the microcontroller unit 120 may be caused to re-enter its default sleep mode.

However, in the event the Sigfox Transmitter integrated circuit 122 is unable to transmit the data packet to the Sigfox network, because, for example, lack of connectivity or access of the Sigfox Transmitter integrated circuit 122 to the Sigfox network, the Sigfox Transmitter integrated circuit 122 may be configured to issue 170 a transmission failed signal to the microcontroller unit 120 through the SPI port. On receipt 172 of the transmission failed signal, the micro-controller unit 120 may be configured to transmit the assembled data packet again to the Sigfox Transmitter integrated circuit 122 through the microcontroller unit's SPI interface port 124, 128, whereupon the Sigfox Transmitter integrated circuit 122 may be configured to transmit the received data packet to the Sigfox network.

In particular, the microcontroller unit 120 may be con-figured to continue re-transmitting the assembled data packet to the Sigfox Transmitter integrated circuit 122 until receipt by the Sigfox Transmitter integrated circuit 122 of a corresponding acknowledgement of received data packet signal from the Sigfox network and consequential receipt by the microcontroller unit 120 of a transmission complete signal from the Sigfox Transmitter integrated circuit 122.

Communications between the microcontroller unit 120 and the Sigfox Transmitter integrated circuit 122 may be conducted in accordance with a pre-defined Master-Slave communications protocol. The steps of the communication protocol are outlined below for an example in which the microcontroller unit 120 is the Master and the Sigfox Transmitter integrated circuit 122 is the Slave 1. Master enables a clock signal to the Slave.
    2. Master pulls the CS (Chip Select) signal low which
        notifies the Slave device that the Master is ready to send
        data (instructions).
    3. Master sends one data bit at a time on the Master Out
        Slave In (MOSI) connection to the Slave,
    4. Slave verifies what it receives by re-sending the data
        back to the Master on the Master in Slave Out (MISO)
        connection.

An important feature of the alert issuing circuit 42 is its ability to self-test and thereby verify that all the hardware and communication functions thereof are operational in case of emergency. This self-test function may be enabled by a double-clicking on the SOS panic button 128. On detection of the double depression of the SOS panic button, the microcontroller unit 120 may be configured to enter a Self Test Mode in which the microcontroller unit 120 tests at least some of its sub-modules and communication functions; generates a test report summarising the outcomes of the tests; and transmits a data packet containing the test report to the Sigfox Transmitter integrated circuit 122 through the microcontroller unit's SPI interface port; and thence to the Sigfox network and a remote Sigfox server (not shown).

Since the Sigfox protocol only supports the transmission of 12 byte data packets, the microcontroller unit 120 may be configured to assign a single bit in the data packet to the result of a given single test. A logical value of 0 for a given bit in the test report data packet may indicate that the corresponding test was passed. By contrast, a logical value of 1 for a given bit in the test report data packet may indicate that the corresponding test was failed. The Sigfox server (not shown) may comprise a plurality of algorithms configured to analyze the test reports and identify faulty units. A further dual coloured LED (not shown) on the fence tester (not shown) may be used to notify the user of the self-test result. A green LED flash may indicate a pass and a red LED flash may indicate a failed test.

While the latching element has been described for latching the blade member in both the open state and the closed state, it is envisaged that in some embodiments of the invention the latching element may be configured to latch the blade member in one of the open or closed states only, and preferably, in the open state.

Modifications and alterations may be made to the above invention without departing from the scope of the invention.

The invention claimed is:

1. An electric fencing wire tester comprising:
a handle member defining an elongated slot-shaped first recess,
a blade member,
a pivot member pivotally coupling the blade member to the handle member with the blade member being pivotal relative to the handle member between an open state with the blade member extending from the handle member and a closed state with the blade member folded into the slot-shaped first recess in the handle member,
a hooking member formed in the handle member and defining an indent in the handle member configured to releasably house an electric fencing wire, and
an electronic monitoring circuit comprising:
a voltage detection circuit formed on a printed circuit board, and
an antenna constructed as a printed circuit board trace printed around the edge of the printed circuit board on which the voltage detection circuit is formed, the antenna having an electrical resistance so that a current induced in the antenna produces a voltage therein, the voltage detection circuit communicating with the antenna for reading a voltage induced in the antenna,
the printed circuit board on which the voltage detection circuit is formed being housed in a second recess in the handle member with a portion of the antenna printed around the edge of the printed circuit board located relative to the indent defined in the handle member by the hooking member, so that the antenna is magnetically coupled to an electric fencing wire located in the indent defined by the hooking member for inducing a flow of electric current in the antenna to produce a voltage in the antenna indicative of a pulsed voltage in the electric fencing wire.

2. An electric fencing wire tester as claimed in claim 1 in which the indent defined by the hooking member defines a centre thereof, and the spacing between the centre of the indent and the antenna is sufficient to permit reliable detection and accurate measurements of the pulsed voltage of an electrical fencing wire located centrally in the indent.

3. An electric fencing wire tester as claimed in claim 2 in which the spacing between the centre of the indent defined by the hooking member and the antenna is approximately 9 mm.

4. An electric fencing wire tester as claimed in claim 1 in which the electronic monitoring circuit is powered by a battery located in the handle member.

* * * * *